(12) United States Patent
Johnson et al.

(10) Patent No.: US 7,119,583 B2
(45) Date of Patent: Oct. 10, 2006

(54) PHASE DETECTOR AND METHOD HAVING HYSTERESIS CHARACTERISTICS

(75) Inventors: Gary Johnson, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/816,178

(22) Filed: Mar. 31, 2004

(65) Prior Publication Data

US 2005/0218937 A1 Oct. 6, 2005

(51) Int. Cl.
*G01R 25/00* (2006.01)
(52) U.S. Cl. .................. 327/12; 327/3; 327/5; 327/7
(58) Field of Classification Search .............. 327/2, 327/3, 7, 12, 39–43, 47, 49, 162, 163, 5; 331/25, DIG. 2
See application file for complete search history.

(56) References Cited

U.S. PATENT DOCUMENTS

| | | | |
|---|---|---|---|
| 3,693,099 A * | 9/1972 | Oberest | 327/7 |
| 4,009,448 A | 2/1977 | Hopwood et al. | 331/4 |
| 4,190,807 A | 2/1980 | Weber | 331/1 A |
| 4,313,089 A | 1/1982 | Predina | 328/155 |
| 4,419,760 A | 12/1983 | Bjornholt | 375/120 |
| 4,459,560 A | 7/1984 | Kurihara | 331/2 |
| 4,470,018 A | 9/1984 | Steinlin | 328/133 |
| 4,523,157 A | 6/1985 | Sato | 331/4 |
| 4,565,976 A | 1/1986 | Campbell | 331/57 |
| 4,599,570 A | 7/1986 | Cloke | 328/155 |
| 4,612,515 A | 9/1986 | Ohkawa et al. | 331/1 A |
| 4,642,562 A | 2/1987 | Collins et al. | 324/83 D |
| 4,691,175 A | 9/1987 | Ecklund | 331/1 A |
| 4,750,193 A | 6/1988 | Bailey | 375/81 |
| 4,752,748 A | 6/1988 | Grzeszykowski | 331/1 A |
| 4,814,726 A | 3/1989 | Byrd et al. | 331/1 A |
| 4,862,106 A | 8/1989 | Toda et al. | 331/2 |
| 4,987,387 A | 1/1991 | Kennedy et al. | 331/1 A |
| 5,034,748 A | 7/1991 | Goedeke et al. | 342/99 |
| 5,057,793 A | 10/1991 | Cowley et al. | 331/1 A |
| 5,239,561 A | 8/1993 | Wong et al. | 375/81 |
| 5,329,559 A | 7/1994 | Wong et al. | 375/119 |
| 5,400,034 A | 3/1995 | Smith | 342/103 |
| 5,477,177 A | 12/1995 | Wong et al. | 327/156 |
| 5,594,361 A | 1/1997 | Campbell | 326/24 |
| 5,602,884 A | 2/1997 | Wieczorkiewicz et al. | 375/376 |
| 5,646,968 A | 7/1997 | Kovacs et al. | 375/375 |
| 5,953,284 A | 9/1999 | Baker et al. | 365/233 |
| 5,977,801 A | 11/1999 | Boerstler | 327/7 |

(Continued)

*Primary Examiner*—My-Trang Nu Ton
*Assistant Examiner*—Hai L. Nguyen
(74) *Attorney, Agent, or Firm*—Dorsey & Whitney, LLP

(57) ABSTRACT

A phase detector generates a first output signal if a feedback clock signal leads a reference clock signal by more than a first time. The phase detector generates a second output signal if the feedback clock signal lags the reference clock signal by more than a second time. If the feedback clock signal either leads the reference clock signal by less than the first time or lags the reference clock signal by less than the second time, neither output signal is generated. The phase detector may be used in a delay-lock loop in which the first and second output signals increase or decrease a delay of the reference clock signal by respective first and second delay increments. In such case, the each of the first and second delay increments should be less than the sum of the first and second times.

50 Claims, 13 Drawing Sheets

U.S. PATENT DOCUMENTS

| | | | |
|---|---|---|---|
| 6,040,742 A | 3/2000 | Bailey et al. | 331/2 |
| 6,094,078 A * | 7/2000 | Suzuki | 327/156 |
| 6,101,197 A | 8/2000 | Keeth et al. | 370/517 |
| 6,154,096 A | 11/2000 | Chien | 331/17 |
| 6,173,432 B1 | 1/2001 | Harrison | 716/1 |
| 6,259,755 B1 | 7/2001 | O'Sullivan et al. | 375/376 |
| 6,275,072 B1 | 8/2001 | Dally et al. | 327/7 |
| 6,320,436 B1 | 11/2001 | Fawcett et al. | 327/158 |
| 6,323,692 B1 * | 11/2001 | Tsinker | 327/12 |
| 6,356,129 B1 | 3/2002 | O'Briene t al. | 327/175 |
| 6,392,495 B1 * | 5/2002 | Larsson | 331/11 |
| 6,480,047 B1 | 11/2002 | Abdel-Maguid et al. | 327/161 |
| 6,496,554 B1 | 12/2002 | Ahn | 375/376 |
| 6,512,711 B1 * | 1/2003 | Wright et al. | 365/203 |
| 6,531,926 B1 | 3/2003 | Pate et al. | 331/17 |
| 6,538,517 B1 * | 3/2003 | Lu | 331/17 |
| 6,545,507 B1 | 4/2003 | Goller | 326/93 |
| 6,590,427 B1 | 7/2003 | Murray et al. | 327/12 |
| 6,636,090 B1 | 10/2003 | Ito | 327/157 |
| 6,640,194 B1 | 10/2003 | Little et al. | 702/74 |
| 6,646,478 B1 | 11/2003 | Lamb | 327/12 |
| 6,704,382 B1 | 3/2004 | Metzler et al. | 375/376 |
| 6,744,293 B1 | 6/2004 | Fu et al. | 327/158 |
| 6,762,626 B1 | 7/2004 | Dreps et al. | 327/2 |
| 6,774,687 B1 | 8/2004 | Gomm et al. | 327/158 |
| 6,839,394 B1 | 1/2005 | Duffy | 375/376 |
| 6,873,669 B1 * | 3/2005 | Nakamura | 375/375 |

\* cited by examiner

PHASE DETECTOR AND METHOD HAVING HYSTERESIS CHARACTERISTICS

TECHNICAL FIELD

This invention relates to closed-loop clock generating devices and methods, and, more particularly, to a phase detector for use in a delay-lock loop that may be advantageously used in a memory device.

BACKGROUND OF THE INVENTION

Phase detectors, which determine the difference in phase between two signals, are used in a variety of circuits. A common use for phase detectors is in closed loop clock generator circuits, such as phase-lock loops and delay-lock loops. A typical delay-lock loop 10 is shown in FIG. 1. The delay-lock loop 10 includes a phase detector 14 that receives a reference clock signal $CLK_{REF}$ and a feedback clock signal $CLK_{FB}$. As explained in greater detail below, the $CLK_{FB}$ signal is derived from a signal generated at the output of the delay-lock loop 10. The delay-lock loop 10 delays the $CLK_{REF}$ signal to produce the output signal by a delay that causes the $CLK_{REF}$ and $CLK_{FB}$ signals to have substantially the same phase.

The phase detector 14 compares the phase of the $CLK_{REF}$ signal to the phase of the $CLK_{FB}$ signal and generates one of two output signals indicative of the phase difference. More specifically, when the phase $CLK_{FB}$ signal leads the phase of the $CLK_{REF}$ signal, the phase detector generates an INCR signal on line 16 to increase the phase of the $CLK_{FB}$ signal. The phase of the $CLK_{FB}$ signal is increased by increasing the delay of the $CLK_{REF}$ signal that is used to generate the $CLK_{FB}$ signal. Conversely, when the $CLK_{FB}$ signal lags the $CLK_{REF}$ signal, the phase detector generates a DECR signal on line 18 to decrease the phase of the $CLK_{FB}$ signal. The phase of the $CLK_{FB}$ signal is decreased by decreasing the delay of the $CLK_{REF}$ signal that is used to generate the $CLK_{FB}$ signal.

The DECR and INCR signals from the phase detector 14 are applied to a delay control circuit 20. The delay control circuit 20 generates delay control signals $DELCON_{A-N}$ that are applied to the control inputs of respective delay cells $24_{A-N}$. The delay cells $24_{A-N}$ are coupled in series with each other from a first delay cell $24_A$ to a last delay cell $24_N$. The first delay cell $24_A$ receives the $CLK_{REF}$ signal and delays it by the number of delay cells $24_{A-N}$ that are enabled by the respective DELCON signals. If a delay cell 24 is not enabled, it simply passes the signal applied to its input directly to its output without any appreciable delay of the input signal. The final delay cell 24N generates an output clock signal $CLK_{OUT}$, which is also used as the $CLK_{FB}$ signal.

In operation, any difference in the phases of the $CLK_{REF}$ and $CLK_{FB}$ signals causes the phase detector 14 to output either a DECR or INCR signal that caused the delay control circuit 20 to alter the number of delay cells 24 that are enabled and hence the delay of the $CLK_{OUT}$ signal relative to the $CLK_{REF}$ signal. More specifically, if the $CLK_{FB}$ signal lags the $CLK_{REF}$ signal, the phase detector 14 generates a DECR signal to reduce the number of enabled delay cells 24, thereby decreasing the phase of the $CLK_{FB}$ signal. Conversely, if the $CLK_{FB}$ signal leads the $CLK_{REF}$ signal, the phase detector 14 generates an INCR signal to increase the number of enabled delay cells 24, thereby increasing the phase of the $CLK_{FB}$ signal.

Although the $CLK_{FB}$ signal is shown in FIG. 1 as being the same as the $CLK_{OUT}$ signal, in practice the $CLK_{FB}$ signal is often taken from a clock tree through which the $CLK_{OUT}$ is coupled. For example, as explained in greater below, the $CLK_{OUT}$ signal may be coupled to an output latch (not shown) of a memory device. The output latch couples a data signal to an externally accessible terminal responsive to a transition of the $CLK_{OUT}$ signal. However, the $CLK_{OUT}$ signal may be delayed as it is coupled to the output latch. By using the clock input of the data latch as the circuit node at which the $CLK_{FB}$ signal is derived, the coupling of data signals to the externally accessible terminal can be synchronized to an externally received $CLK_{REF}$ signal.

In another type of delay-lock loop, the DELCON signal generated by the delay control circuit 20 is an analog signal or a set of digital signals that controls the magnitude delay of each of the delay cells $24_{A-N}$ rather than the number of delay cells $24_{A-N}$ that are enabled. The delay of each of the delay cells $24_{A-N}$ is typically incrementally increased or decreased responsive to the respective INCR or DECR signals generated by the phase detector 14.

Another closed loop clock generator circuit that uses a phase detector is a phase-lock loop. A typical phase-lock loop 30 is shown in FIG. 2. The phase-lock loop 30 includes the phase detector 14 used in the delay-lock loop of FIG. 1, and it operates on $CLK_{REF}$ and $CLK_{FB}$ signals in the same manner as described above. The INCR and DECR signals from the phase detector 14 are coupled to a frequency control circuit 34 that generates a frequency control signal FREQCON, which may be either an analog signal or a set of digital signals. The FREQCON signal is applied to a control input of a voltage-controlled oscillator 38, which generates an output clock signal $CLK_{OUT}$ having a frequency that is determined by the magnitude of the FREQCON signal. The $CLK_{OUT}$ signal is again used as the $CLK_{FB}$ signal that is applied to the phase detector 14.

In operation, any difference in the phases of the $CLK_{REF}$ and $CLK_{FB}$ signals causes the phase detector 14 to output either an INCR or DECR signal that caused the frequency control circuit 34 to alter the frequency of the $CLK_{OUT}$ signal generated by the voltage-controlled oscillator 38. If the $CLK_{FB}$ signal lags the $CLK_{REF}$ signal, the phase detector 14 generates a DECR signal to cause the voltage-controlled oscillator 38 to decrease the period of the $CLK_{FB}$ signal. As a result, the phase of the $CLK_{FB}$ signal is increased so that it's phase is closer to the phase of the $CLK_{REF}$ signal. Conversely, If the $CLK_{FB}$ signal leads the $CLK_{REF}$ signal, the phase detector 14 generates an INCR signal to cause the voltage-controlled oscillator 38 to increase the period of the $CLK_{FB}$ signal. As a result, the phase of the $CLK_{FB}$ signal decreases to be closer to the phase of the $CLK_{REF}$ signal.

Typical phase-lock loops often include components in addition to the phase detector 14 and voltage-controlled oscillator 38, such as a loop amplifier (not shown) to increase the gain of the feedback loop, and a loop filter (not shown) to filter out any high frequency components in the signal controlling the voltage-controlled oscillator 38 and to control the dynamics of the loop.

A typical phase detector 40 that may be used in a delay-lock loop or phase-lock loop, including the delay-lock loop 10 of FIG. 1 and the phase-lock loop 30 of FIG. 2 is shown in FIG. 3. The phase detector 40 includes a first NAND gate 42 that receives the $CLK_{REF}$ signal, and a second NAND gate 44 that receives the $CLK_{FB}$ signal. Both of these NAND gates 42, 44 are enabled by their other inputs being coupled to a supply voltage $V_{CC}$. The output of each of the NAND gates 42, 44 is coupled to an input of a respective NAND gate 46, 48 through respective inverters 50, 52. The NAND gates 46, 48 are coupled to each other to form a flip-flop 56, which is reset by a low applied to the inputs of both NAND gate 48 and NAND gate 46 and set by the first high-going transition applied to the inputs of the NAND gates 48 and 46. As explained below, the flip-flop 56 functions as a comparator to compare the phase of the $CLK_{REF}$ signal to the phase of the $CLK_{FB}$ signal.

The outputs of the flip-flop 56 are coupled to an output circuit 60 that functions as a signal generator to generate either the INCR signal or the DECR signal. As explained in greater detail below, the output circuit 60 generates an active high INCR signal when the output of the NAND gate 48 transitions low. Similarly, the output circuit 60 also generates an active high DECR signal when the output of the NAND gate 46 transitions low. The output circuit 60 includes a first PMOS transistor 62 and a first NMOS transistor 64 coupled in series between the output of the NAND gate 46 and ground. The gates of the transistors 62, 64 are coupled to the output of the NAND gate 48, the input of INV gate 102 is coupled to the drains of the transistors 62, 64. The output circuit also includes a second PMOS transistor 66 and a second NMOS transistor 68 coupled in series between the output of the NAND gate 48 and ground. The gates of the transistors 66, 68 are coupled to the output of the NAND gate 46, and the input of INV gate 124 is coupled to the drains of the transistors 66, 68.

When the output of the NAND gate 48 is low, the output of the NAND gate 46 will be high. The low at the output of the NAND gate 48 turns ON the PMOS transistor 62 and turns OFF the NMOS transistor 64, thereby coupling the high at the output of the NAND gate 46 to the input of INV gate 102. At the same time, the high at the output of the NAND gate 46 turns ON the NMOS transistor 68 to hold the input to INV gate 124 low. In the same manner, when the output of the NAND gate 46 is low, the output of the NAND gate 48 will be high. The low at the output of the NAND gate 46 turns ON the PMOS transistor 66 and turns OFF the NMOS transistor 68, thereby coupling the high at the output of the NAND gate 48 to the input of INV gate 124. The high at the output of the NAND gate 48 also turns ON the NMOS transistor 64 to hold the input to INV gate 102 low. During reset, when both of the NAND gates 46, 48 simultaneously receive a low at their respective inputs, the outputs of both NAND gates 46, 48 will be high. In such case, the high at the output of the NAND gate 46 will turn OFF the PMOS transistor 66 and turn ON the NMOS transistor 68, thereby holding the input of INV gate 124 low. Similarly, the high at the output of the NAND gate 48 will turn OFF the PMOS transistor 62 and turn ON the NMOS transistor 64, thereby holding the inut of NV gate 102 low.

The signal E is coupled through a pair of inverters 96, 98 to a NAND gate 100. The NAND gate 100 also receives the $CLK_{REF}$ signal after being coupled through a pair of inverters 106, 108, and the $CLK_{FB}$ signal after being coupled through a pair of inverters 110, 112. In a similar manner, the signal F is coupled through a pair of inverters 116, 118 to a second NAND gate 120. The NAND gate 120 also receives the $CLK_{REF}$ signal coupled through the inverters 104, 108, and it also receives the $CLK_{FB}$ signal coupled through the inverters 110, 112.

The overall operation of the phase detector 40 will now be explained with reference to the timing diagrams shown in FIGS. 4 and 5 in which the signals "A"–"D" are present at the correspondingly marked nodes of the phase detector 40 as shown in FIG. 3, "A" is the $CLK_{REF}$ signal, and "B" is the $CLK_{FB}$ signal. With reference, first, to FIG. 4 in which the $CLK_{FB}$ signal lags the $CLK_{REF}$ signal, just prior to time $t_0$, both "A" and "B" are low, thereby making both "C" and "D" high. As a result, the output circuit 60 holds both E and F low. At time $t_0$, "A" transitions high so that the NAND gate 46 receives that high as well as the high "D" signal, thereby causing the signal "C" at the output of the NAND gate 46 to transition low. The low "C" signal causes the "D" signal at the output of the NAND gate 48 to remain high after $t_1$ when the signal "B" transitions high. The low "C" signal causes the output circuit 60 to couple the high at the output of the NAND gate 48 to line 18 to generate an active high F signal while the E signal is low. The NAND gate 100 will cause the INCR signal to be active high only if all of its inputs are high. However, as is apparent from FIG. 4, there is no time where the signal E, $CLK_{REF}$, and $CLK_{FB}$ are all high. Therefore, the INCR signal remains inactive low. Signal F is applied to the NAND gate 120 along with the $CLK_{REF}$ and $CLK_{FB}$ signals. From FIG. 4 it can be seen that the signals F, $CLK_{REF}$, and $CLK_{FB}$ are all high for a period of time, thereby causing the DECR signal to go high. Therefore, when the $CLK_{REF}$ signal leads the $CLK_{FB}$ signal a DECR signal is generated. At time $t_2$, the signal "A" transitions low, thereby causing the signal "C" at the output of the NAND gate 46 to transition high. The NAND gate 48 then receives the high "B" signal and the high "C" signal, so that the "D" signal at the output of the NAND gate 48 transitions low. The low "D" signal causes the output circuit 60 to couple the high "C" signal to line 16, thereby producing an active high E signal. The high "C" signal as well as the low "D" signal cause the F signal to remain low during this time. However, since $CLK_{REF}$, and $CLK_{FB}$ are not both high, the outputs of NAND 100 and NAND 120 are held high, resulting in DECR and INCR being held low during this period. At $t_3$, the "B" signal transitions low, thereby causing the "D" signal to transition high. Since the low "A" signal also causes the "C" signal to be high, the output circuit 60 holds both the E and F signals low, and hence the INCR and DECR signals are both low. At time $t_4$, the operation repeats the operation explained above starting at time $t_0$.

The operation of the phase detector 40 for the $CLK_{FB}$ signal leading the $CLK_{REF}$ signal will now be explained with reference to FIG. 5. Just prior to time $t_0$, both "A" and "B" are low, thereby making both "C" and "D" high. As a result, the output circuit 60 holds both E and F low. At time $t_0$, signal "B" transitions high so that the NAND gate 48 receives that high as well as the high "C" signal, thereby causing the signal "D" at the output of the NAND gate 48 to transition low. The low "D" signal causes the "C" signal at the output of the NAND gate 46 to remain high after $t_1$ when the signal "A" transitions high. The low "D" signal causes the output circuit 60 to couple the high at the output of the NAND gate 46 to line 16 to generate an active high E signal while the F signal is held low. The NAND gate 120 will cause the DECR signal to be active high only if all of its inputs are high. However, as is apparent from FIG. 5, there is no time where the signals "F", $CLK_{REF}$, and $CLK_{FB}$ are all high at the same time. Therefore, the DECR signal remains inactive low. Similarly, the signal "E" is applied to the NAND gate 100 along with the $CLK_{REF}$ and $CLK_{FB}$ signals. From FIG. 5 it can be seen that the signals "E", $CLK_{REF}$, and $CLK_{FB}$ are all high for a period of time, thereby causing the INCR signal to go high. Therefore, when the $CLK_{FB}$ signal leads the $CLK_{REF}$ signal, an INCR signal is generated. At time $t_2$, the signal "B" transitions low, thereby causing the signal "D" at the output of the NAND gate 48 to transition high. The NAND gate 46 then receives the high "A" signal and the high "D" signal, so that the "C"

signal at the output of the NAND gate 46 transitions low. The low "C" signal causes the output circuit 60 to couple the high "D" signal to line 18, thereby producing an active high F signal. The high "D" signal as well as the low "C" signal cause the E signal to remain low during this time. However, since $CLK_{REF}$ and $CLK_{FB}$ are not both high, the outputs of NAND gate 120 and NAND gate 100 are held high, resulting in DECR and INCR being held low during this period. At $t_3$, the "A" signal transitions low, thereby causing the "C" signal to transition high. Since the low "B" signal also causes the "D" signal to be high, the output circuit 60 holds both the E and F signals low, and hence the INCR and DECR signals are both held low. At time $t_4$, the operation repeats the operation explained above starting at time $t_0$.

Comparing FIGS. 4 and 5, it can be seen that, when the $CLK_{FB}$ signal lags the $CLK_{REF}$ signal as shown in FIG. 4, the DECR signal is active high. As a result, the phase of the $CLK_{FB}$ signal will be decreased toward the phase of the phase of the $CLK_{REF}$ signal. When the $CLK_{FB}$ signal leads the $CLK_{REF}$ signal as shown in FIG. 4, the INCR signal is active high. As a result, the phase of the $CLK_{FB}$ signal will be increased toward the phase of the phase of the $CLK_{REF}$ signal.

Although the phase detector 40 can provide adequate control of the phase of the CLK signal in many instances, it has the sometimes serious disadvantage of producing a great deal of "phase jitter." Phase jitter is a term referring to high frequency variations in the phase of a periodic signal, such as the $CLK_{OUT}$ signal produced by a closed-loop clock generator circuit. Phase jitter can have several different causes. For example, in a phase-lock loop phase jitter can result from high frequency components in an error signal that is produced by a phase detector and not adequately attenuated by a loop filter. Phase jitter can be produced in the delay lock loop 10 of FIG. 1 and in the phase-lock loop 30 of FIG. 2, as well as in similar closed-loop circuits, because of the characteristics of the phase detector 14 used in those circuits, such as the phase detector 40 shown in FIG. 3.

The phase detector 40 will produce phase jitter any time the increase or decrease in the phase of the $CLK_{OUT}$ signal resulting from the INCR or DECR signal, respectively, is greater than the phase difference between the $CLK_{REF}$ and $CLK_{FB}$ signal that resulted in the INCR or DECR signal being generated. From the point of view of time delays rather than phase differences, clock jitter will occur any time the increase or decrease in the delay of the $CLK_{OUT}$ signal resulting from the INCR or DECR signal, respectively, is greater than the difference in time between a transition of the $CLK_{REF}$ and a corresponding transition of the $CLK_{FB}$ signal that resulted in the INCR or DECR signal being generated. For example, if the $CLK_{FB}$ signal lags $CLK_{REF}$ the signal by 25 picoseconds ("ps"), the phase detector 14 will produce an DECR signal to reduce the phase or delay time of the $CLK_{FB}$ signal. If the minimum increment in the delay time of the delay-lock loop 10 or phase-lock loop 30 is 50 ps, the DECR signal will cause the timing of the $CLK_{OUT}$ signal to be reduced by 50 ps. On the next transition of the $CLK_{REF}$ signal, the $CLK_{FB}$ signal will now lead the $CLK_{REF}$ signal by 25 ps (i.e., the original 25 ps lead minus the 50 ps adjustment). As a result, the phase detector 14 will produce an INCR signal, which will cause the timing of the $CLK_{FB}$ signal to be increased by 50 ps thereby causing the $CLK_{FB}$ to again lag the $CLK_{REF}$ signal by 25 ps. The phase or timing of the $CLK_{OUT}$ and $CLK_{FB}$ signals will continue to jump back and forth by 50 ps in this manner. This type of phase jitter will occur with any "arbiter" phase detector that, like the phase detector 14, produces an output signal based on whether the $CLK_{REF}$ signal leads or lags the $CLK_{FB}$ signal. The phase jitter that is present on the $CLK_{OUT}$ signal can greatly reduce the ability of the $CLK_{OUT}$ signal to be used for various purposes. For example, using the $CLK_{OUT}$ signal to clock read data signals out of a memory device will cause the read data signals to have a great deal of phase jitter, thereby making it more difficult to capture the read data signals at a memory controller or other device. This problem can be particularly severe at higher clock speeds where the period of time that data signals are valid becomes increasingly small.

There is therefore a need for a phase detector that can be used in a closed-loop clock generating circuit that does not inherently cause the closed-loop clock generating circuit to produce a $CLK_{OUT}$ signal having continuous phase jitter.

SUMMARY OF THE INVENTION

A phase detector generating either a first control signal or a second control signal responsive to a difference in phase between a reference clock signal and a feedback clock signal. The phase detector includes a signal comparator that compares the phase of the feedback clock signal to the phase of the reference clock signal. Based on this comparison, a signal generator generates the first control signal when the phase of the feedback clock signal is greater than the phase of the reference clock signal by at least a first phase difference, and it generates the second control when the phase of the feedback clock signal is less than the phase of the reference clock signal by at least a second phase difference. When the phase of the feedback clock signal is in a "deadband" in which it is greater than the phase of the reference clock signal by less than the first phase difference or less than the phase of the reference clock signal by less than the second phase difference, neither the first control signal nor the second control signal is generated. The phase detector can advantageously be used in a closed-loop signal generating circuit, such as a delay-lock loop.

DETAILED DESCRIPTION

Figure 6:
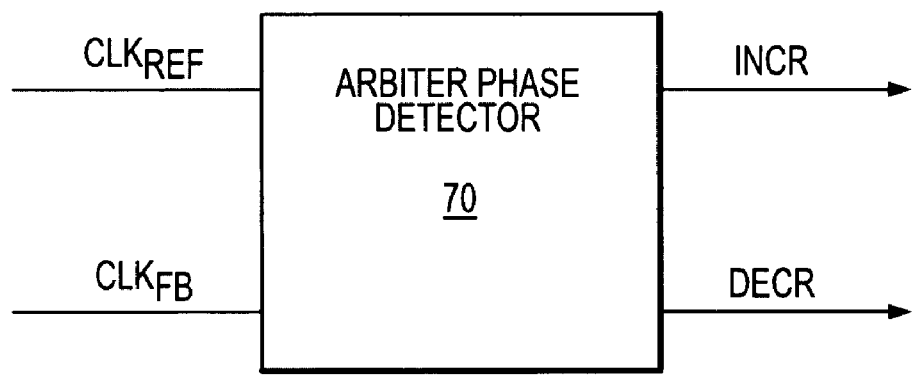
FIG. 6 is a block diagram of an arbiter phase detector according to one embodiment of the invention, which may be used in the closed-loop circuits of FIGS. 1 and 2.
Figure 7:
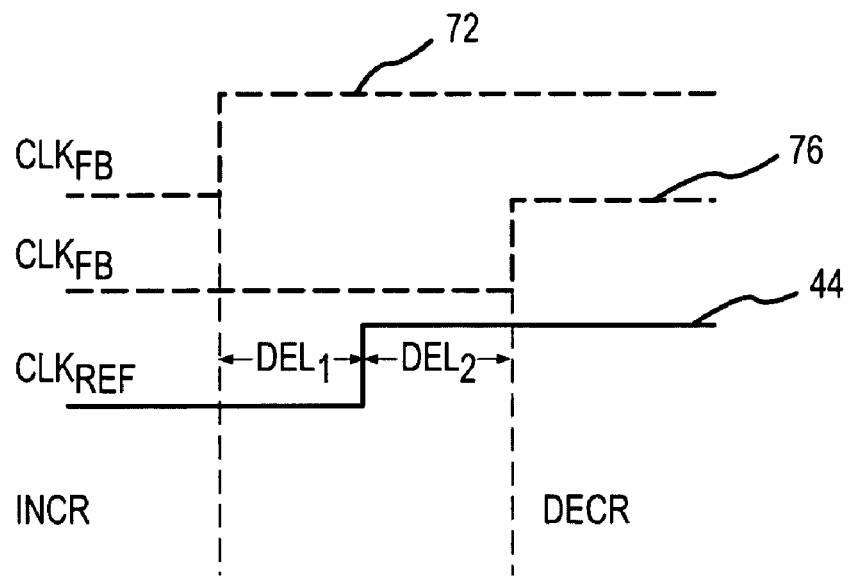
FIG. 7 is a schematic diagram showing the operating characteristics of the phase detector of FIG. 6.

An arbiter phase detector 70 according to one embodiment of the invention is shown in FIG. 6, and the operating characteristics of the phase detector 70 are shown in FIG. 7. FIG. 7 shows various phases of the $CLK_{FB}$ signal in dotted limes relative to the $CLK_{REF}$ signal. More specifically, the $CLK_{FB}$ signal 72 is shown leading the $CLK_{REF}$ signal 74 by a first delay value $DEL_1$, and the $CLK_{FB}$ signal 76 is shown lagging the $CLK_{REF}$ value by a second value $DEL_2$. When the $CLK_{FB}$ signal leads the $CLK_{REF}$ signal by more than the delay value $DEL_1$, the phase detector 70 generates an INCR signal. When the phase detector 70 is used in a delay-lock loop, phase-lock loop or other closed-loop circuit, the INCR signal causes the delay of the $CLK_{FB}$ signal to be increased so that the phase difference between the $CLK_{FB}$ signal and the $CLK_{REF}$ signal decreases. When the $CLK_{FB}$ signal lags the $CLK_{REF}$ signal by more than the delay value $DEL_2$, the phase detector 70 generates a DECR signal. The DECR signal causes the delay of the $CLK_{FB}$ signal to be decreased so that the phase difference between the $CLK_{FB}$ signal and the $CLK_{REF}$ signal decreases. Significantly, when the $CLK_{FB}$ signal leads the $CLK_{REF}$ signal by less than the first delay value $DEL_1$ or lags the $CLK_{REF}$ signal by less that the second delay value $DEL_2$, neither the INCR signal nor the DECR signal is generated.

The delay values $DEL_1$ and $DEL_2$ are preferably but not necessarily equal to each other. However, when the phase detector 70 is used in a delay-lock loop, phase-lock loop or other closed-loop circuit, the sum of the delay values $DEL_1$ and $DEL_2$ should be greater than any change in the delay of the $CLK_{FB}$ signal resulting from the INCR or DECR signal, respectively. As a result, if the $CLK_{FB}$ signal leads the $CLK_{REF}$ signal by more than the delay value $DEL_1$, the INCR signal generated by the phase detector 70 will not cause an increase in the delay of the $CLK_{FB}$ signal to such an extent that the $CLK_{FB}$ signal then lags the $CLK_{REF}$ signal by more than the delay value $DEL_2$. Similarly, if the $CLK_{FB}$ signal lags the $CLK_{REF}$ signal by more than the delay value $DEL_2$, the DECR signal generated by the phase detector 70 will not cause an decrease in the delay of the $CLK_{FB}$ signal to such an extent that the $CLK_{FB}$ signal then leads the $CLK_{REF}$ signal by more than the delay value $DEL_1$. If the sum of the delay values $DEL_1$ and $DEL_2$ was not greater than any change in the delay of the $CLK_{FB}$ signal resulting from the INCR or DECR signal, respectively, the phase detector 70 could continuously cause phase jitter for the previously explained reasons.

Figure 3:
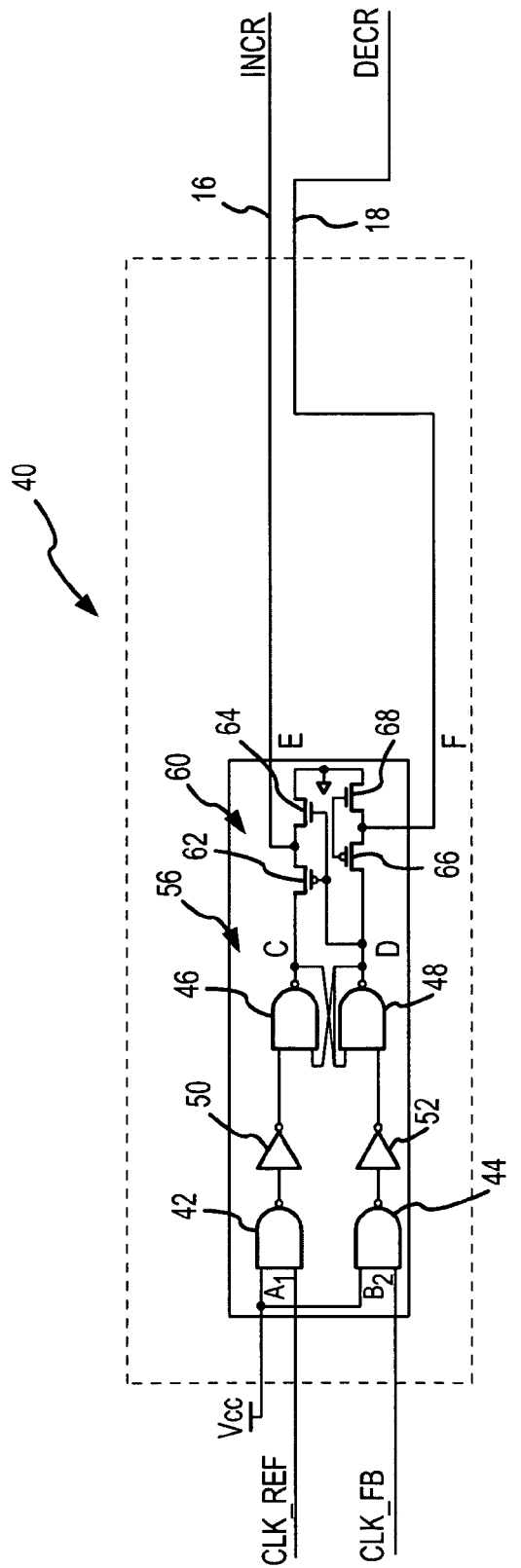
FIG. 3 is a block diagram of a conventional arbiter phase detector of the type used in the closed-loop circuits of FIGS. 1 and 2.
Figure 8:
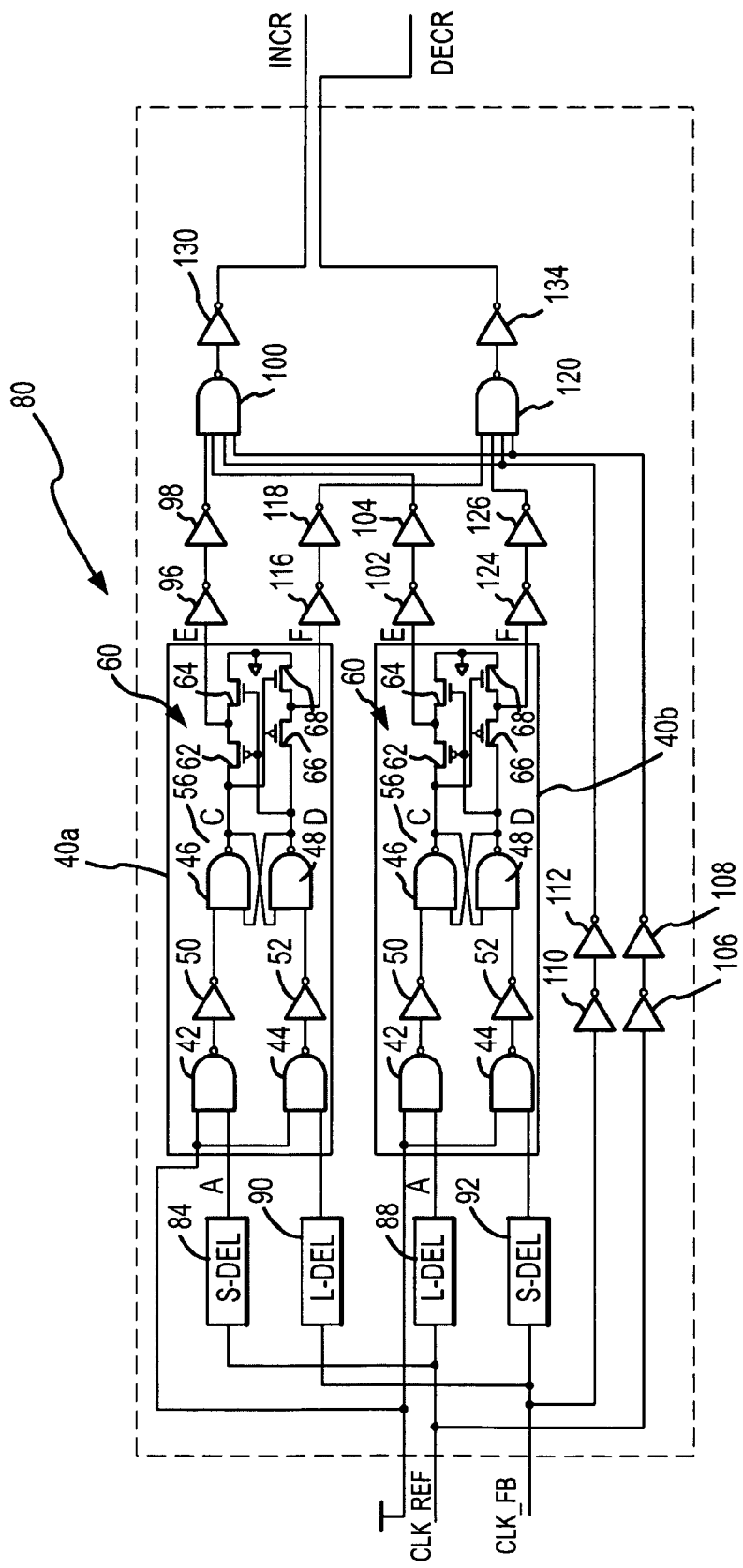
FIG. 8 is a block diagram of one embodiment of the arbiter phase detector of FIG. 6.

A more specific embodiment of an arbiter phase detector 80 according to the present invention is shown in FIG. 8. The phase detector 80 includes two of the phase detectors 40 shown in FIG. 3, which are designated 40a and 40b in FIG. 8. However, instead of receiving the $CLK_{REF}$ signal, the NAND gate 42 of the phase detector 40a receives the $CLK_{REF}$ signal through a delay circuit 84. The delay circuit 84 delays the $CLK_{REF}$ signal by a first relatively short delay value S-DEL. The NAND gate 42 of the phase detector 40b receives the $CLK_{REF}$ signal through a delay circuit 88, which delays the $CLK_{REF}$ signal by a first relatively long delay value L-DEL.

Similarly, the NAND gate 44 of the phase detector 40a receives the $CLK_{FB}$ signal through a delay circuit 90, which delays the $CLK_{FB}$ signal by the first relatively long delay value L-DEL. The NAND gate 44 of the phase detector 40b receives the $CLK_{FB}$ signal through a delay circuit 92, which delays the $CLK_{FB}$ signal by the first relatively short delay value S-DEL.

The signal E is coupled through a pair of inverters 96, 98 to a NAND gate 100. The NAND gate 100 also receives the signal $E_2$ from the phase detector 40b after being coupled through a pair of inverters 102, 104. Finally, the NAND gate 100 receives the $CLK_{REF}$ signal after being coupled through a pair of inverters 106, 108, and the $CLK_{FB}$ signal after being coupled through a pair of inverters 110, 112. In a similar manner, the signal $F_1$ is coupled from the phase detector 40a through a pair of inverters 116, 118 to a second NAND gate 120. The NAND gate 120 also receives the signal $F_2$ from the phase detector 40b through a pair of inverters 124, 126. Finally, the NAND gate 120 receives the $CLK_{REF}$ signal coupled through the inverters 104, 108, and it also receives the $CLK_{FB}$ signal coupled through the inverters 110, 112.

An output of the NAND gate 100 is coupled through an inverter 130 to provide the INCR signal, and an output of the NAND gate 120 is coupled through an inverter 134 to provide the DECR signal.

Figure 9:
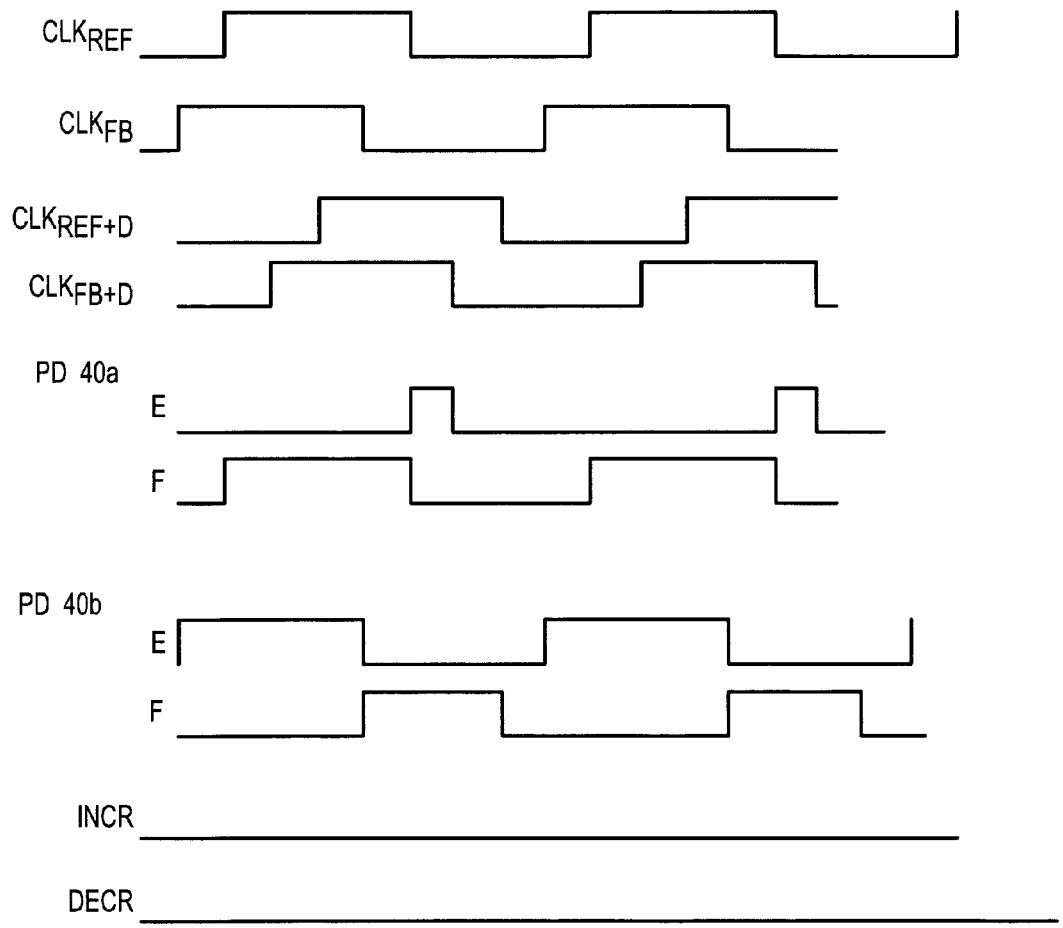
FIG. 9 is a timing diagram showing various signals in the phase detector of FIG. 8 in a situation where a $CLK_{FB}$ signal slightly leads a $CLK_{REF}$ signal.

The operation of the phase detector 80 of FIG. 8 will now be explained with reference to the timing diagrams of FIGS. 9–12. With reference, first, to FIG. 9, the $CLK_{FB}$ signal is shown as leading the $CLK_{REF}$ signal by a relatively short delay period. The signal "$CLK_{REF}$+D" is the $CLK_{REF}$ signal after being delayed by the L-DEL value, and the signal "$CLK_{FB}$+D" is the $CLK_{FB}$ signal after being delayed by the L-DEL value. The signals "E" and "F" are taken at the outputs of the phase detectors 40a, 40b. As shown in FIG. 9, it is assumed that the delay value S-DEL of the delay circuits 84, 92 is infinitesimal, and the delay value L-DEL of the delay circuits 90, 88 is about ¼ of the period of the $CLK_{REF}$ signal. However, other values for S-DEL and L-DEL may, of course, be used.

Figure 4:
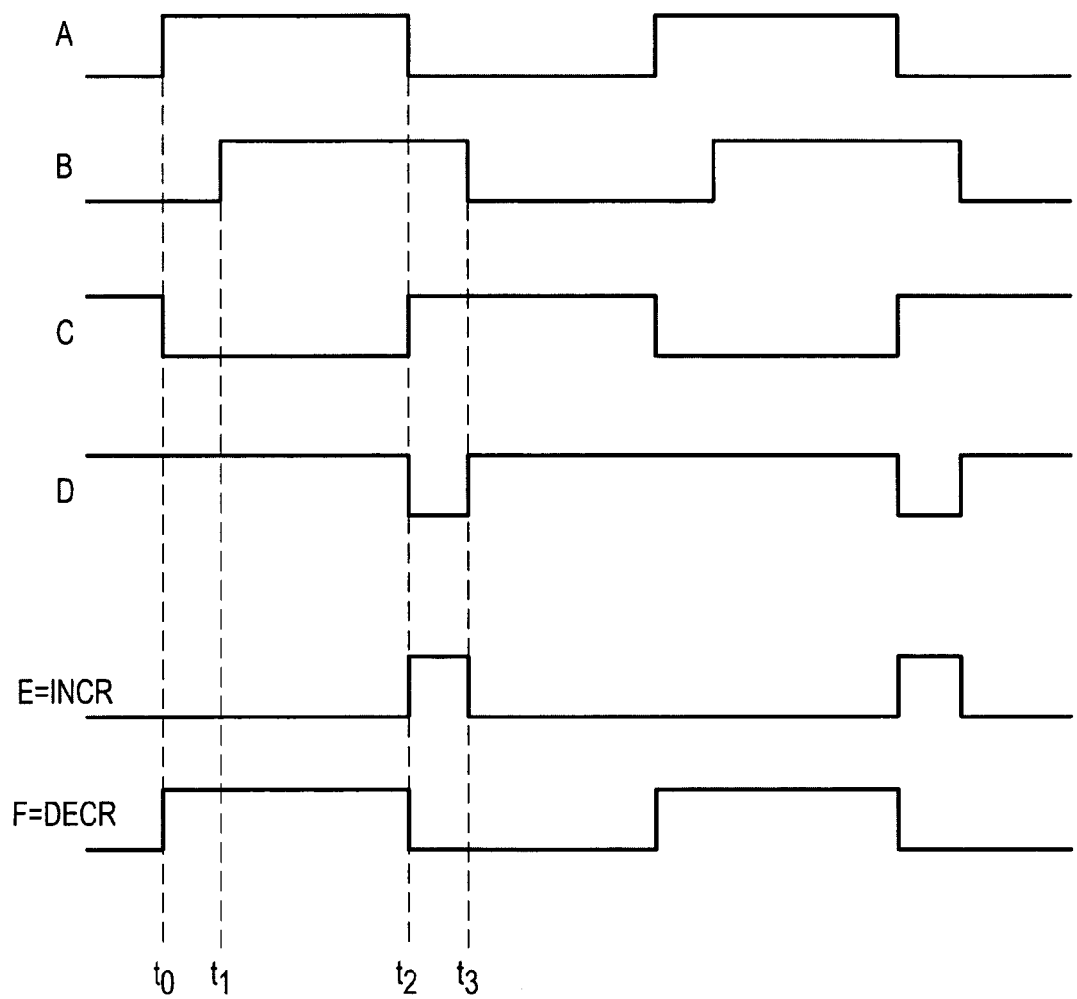
FIG. 4 is a timing diagram showing various signals in the phase detector of FIG. 3 in a situation where a $CLK_{REF}$ signal leads a $CLK_{FB}$ signal.

With reference back to FIG. 4, it can be seen that the signal "E" at the output of the phase detector 40 has a rising edge coincident with the falling edge of the signal "A" at the input to the NAND gate 42 when the signal "A" leads the signal "B". With reference to FIG. 9, in the same manner, when the signal $CLK_{REF}$ applied to the NAND gate 42 of the phase detector 40a leads the signal $CLK_{FB}$+D applied to the NAND gate 44 in the phase detector 40a, the signal "E" at the output of the phase detector 40a has a rising edge coincident with the falling edge of the $CLK_{REF}$ signal at the input to the NAND gate 42. Further, as shown in FIG. 4, the signal "E" at the output of the phase detector 40 has a falling edge that is coincident with falling edge of the signal "B" at the input to the NAND gate 44 when the signal "A" leads the signal "B". With reference to FIG. 9, in the same manner, the signal "E" at the output of the phase detector 40a has a falling edge coincident with the falling edge of the $CLK_{FB}$+D signal at the input to the NAND gate 44. The signal "E" at the output of the phase detector 40a is thus as shown in FIG. 9.

With reference, again, to FIG. 4, the signal "F" has rising and falling edges that are coincident with the rising and falling edges of the signal "A" at the input to the NAND gate 42. In the same manner, the signal "F" at the output of the phase detector 40a has rising and falling edges that are coincident with the rising and falling edges of the $CLK_{REF}$ signal as shown in FIG. 9.

Figure 5:
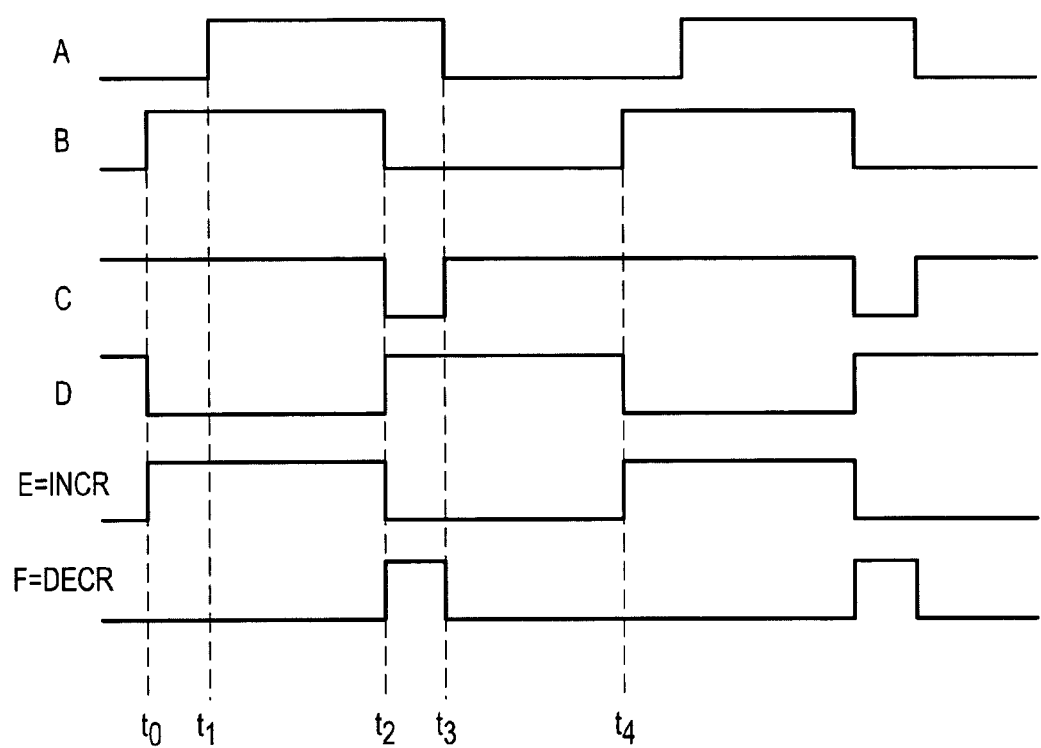
FIG. 5 is a timing diagram showing various signals in the phase detector of FIG. 3 in a situation where a $CLK_{REF}$ signal lags a $CLK_{FB}$ signal.

With reference to FIG. 5, it can be seen that the signal "E" at the output of the phase detector 40 has rising and falling edges that are coincident with the rising and falling edges of the signal "B" at the input to the NAND gate 44 when the signal "A" lags the signal "B". In the same manner, the signal "F" at the output of the phase detector 40b has rising and falling edges that are coincident with the rising and falling edges of the $CLK_{FB}$ signal as shown in FIG. 9. With reference back to FIG. 5, it can be seen that the signal F at the output of the phase detector 40 has a rising edge coincident with the falling edge of the signal "B" at the input to the NAND gate 44. With reference to FIG. 9, in the same manner, when the $CLK_{FB}$ signal applied to the NAND gate 44 of the phase detector 40a leads the signal $CLK_{REF}$+D applied to the NAND gate 42 in the phase detector 40a, the signal "F" at the output of the phase detector 40b has a rising edge coincident with the falling edge of the $CLK_{FB}$ signal at the input to the NAND gate 44. Further, as shown in FIG. 4, the signal "F" at the output of the phase detector 40 has a falling edge that is coincident with falling edge of the signal "A" at the input to the NAND gate 42. With reference to FIG. 9, in the same manner, the signal "F" at the output of the phase detector 40b has a falling edge coincident with the falling edge of the $CLK_{REF}$+D signal at the input to the NAND gate 42. The signal "F" at the output of the phase detector 40b is thus as shown in FIG. 9.

As explained above, the signals "E" at the outputs of the phase detectors 40a,b are applied to the NAND gate 100 along with the $CLK_{REF}$ and $CLK_{FB}$ signals coupled through the inverters 106, 108 and 110, 112 respectively. The NAND gate 100 will cause the INCR signal to be active high only if all of its inputs are high. However, as is apparent from FIG. 9, there is no time where the signals "E" at the outputs of the phase detectors 40a,b are both high. Therefore, the INCR signal remains inactive low. Similarly, the signals "F" at the outputs of the phase detectors 40a,b are applied to the NAND gate 120 along with the $CLK_{REF}$ and $CLK_{FB}$ signals. From FIG. 9 it can be seen that the signals "F" at the outputs of the phase detectors 40a,b are both high only during a short period following each rising edge of the "F" signal from the phase detector 40b. However, during this period, the $CLK_{FB}$ signal is low, thereby causing the DECR signal to remain low. Therefore, when the $CLK_{FB}$ signal leads the $CLK_{REF}$ signal by a short delay period, neither the INCR signal nor the DECR signal is generated.

Figure 10:
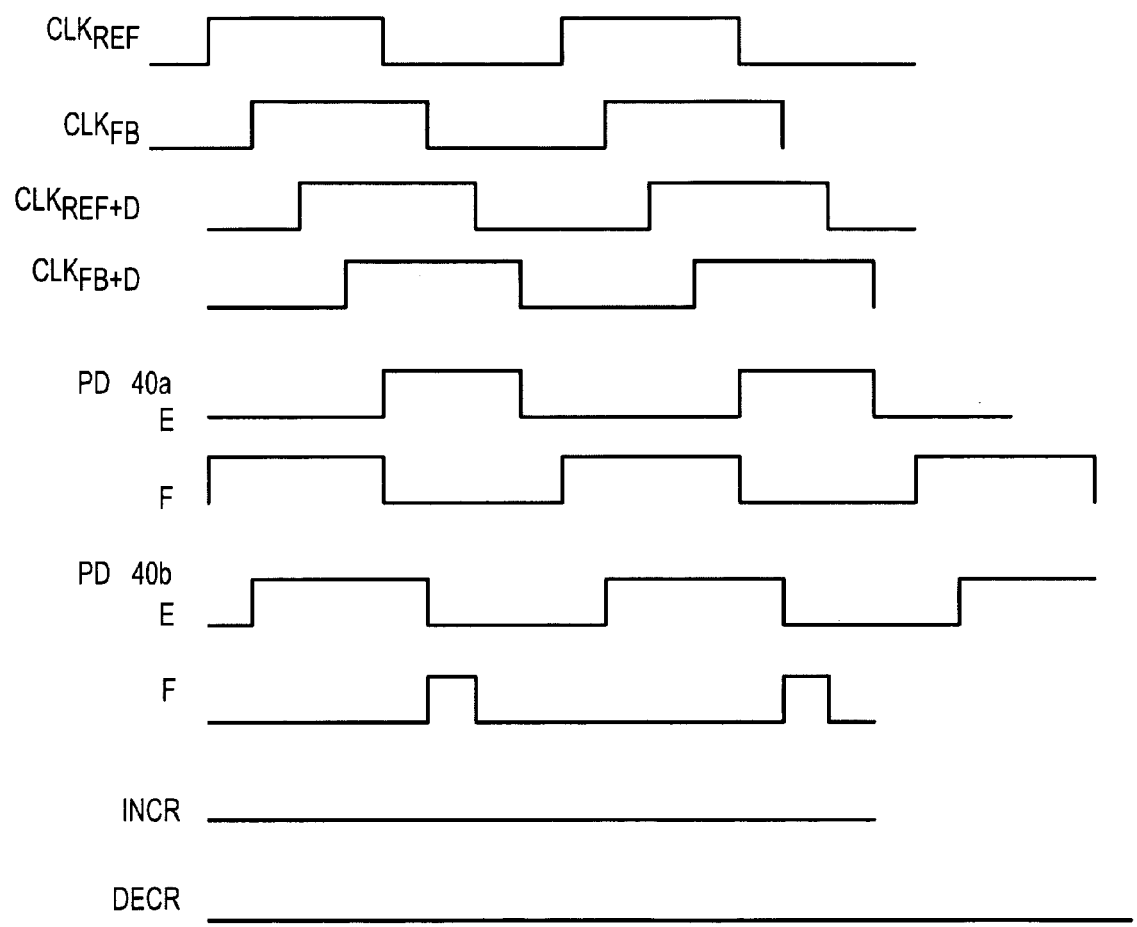
FIG. 10 is a timing diagram showing various signals in the phase detector of FIG. 8 in a situation where a $CLK_{FB}$ signal slightly lags a $CLK_{REF}$ signal.

The operation of the phase detector 80 of FIG. 8 for a situation where the $CLK_{FB}$ signal lags the $CLK_{REF}$ signal by a relatively short delay period is shown in FIG. 10, and can be explained with reference to FIGS. 4 and 5 in the same manner that the operation for the $CLK_{FB}$ signal leading the $CLK_{REF}$ signal by a relatively short delay period was explained. With reference to FIG. 10, for the phase detector 40a, the $CLK_{FB}$+D signal applied to the NAND gate 44 will lag the $CLK_{REF}$ signal by even a greater delay than the $CLK_{FB}$ signal already lags the $CLK_{REF}$ signal. The signals "E" and "F" at the output of the phase detector 40a will thus have the same characteristics as shown in FIG. 4. More specifically, the signal "E" will have a rising edge that is coincident with the falling edge of the $CLK_{REF}$ signal applied to the NAND gate 42 and a falling edge that is coincident with the falling edge of the $CLK_{FB}$+D signal applied to the NAND gate 44. However, for the phase detector 40b, the $CLK_{REF}$ signal, which leads the $CLK_{FB}$ signal, is delayed by the delay circuit 88 to such an extent that the $CLK_{REF}$+D signal applied to the NAND gate 42 lags the $CLK_{FB}$ signal applied to the NAND gate 44. As a result, the timing diagram shown in FIG. 5 shows the timing relationships present in the phase detector 40b. More specifically, the signal "E" of the phase detector 40b is coincident with the $CLK_{FB}$ signal applied to the NAND gate 44, as shown in FIG. 10. With further reference to FIG. 5, the signal "F" of the phase detector 40b has a rising edge that is coincident with the falling edge of the $CLK_{REF}$ signal applied to the NAND gate 44, and a falling edge that is coincident with the falling edge of the $CLK_{REF}$+D signal applied to the NAND gate 42, as shown in FIG. 10.

As explained above, the NAND gate 100 does not cause an active high INCR signal to be generated unless the "E" signals from both phase detectors 40a,b, as well as the $CLK_{REF}$ and $CLK_{FB}$ signals, are all high. Although the "E" signals from the phase detectors 40a,b are both high for a short period after the rising edge of the "E" signal from the phase detector 40a, the $CLK_{REF}$ signal is low during this time, thereby holding the INCR signal inactive low. Similarly, the NAND gate 120 does not cause an active high DECR signal to be generated unless the "F" signals from both phase detectors 40a,b, as well as the $CLK_{REF}$ and $CLK_{FB}$ signals, are all high. However, the "F" signals from both phase detectors 40a,b are never high at the same time. Therefore, the DECR signal is maintained inactive low. Therefore, when the $CLK_{FB}$ signal lags the $CLK_{REF}$ signal by a short delay period, neither the INCR signal nor the DECR signal is generated.

Figure 11:
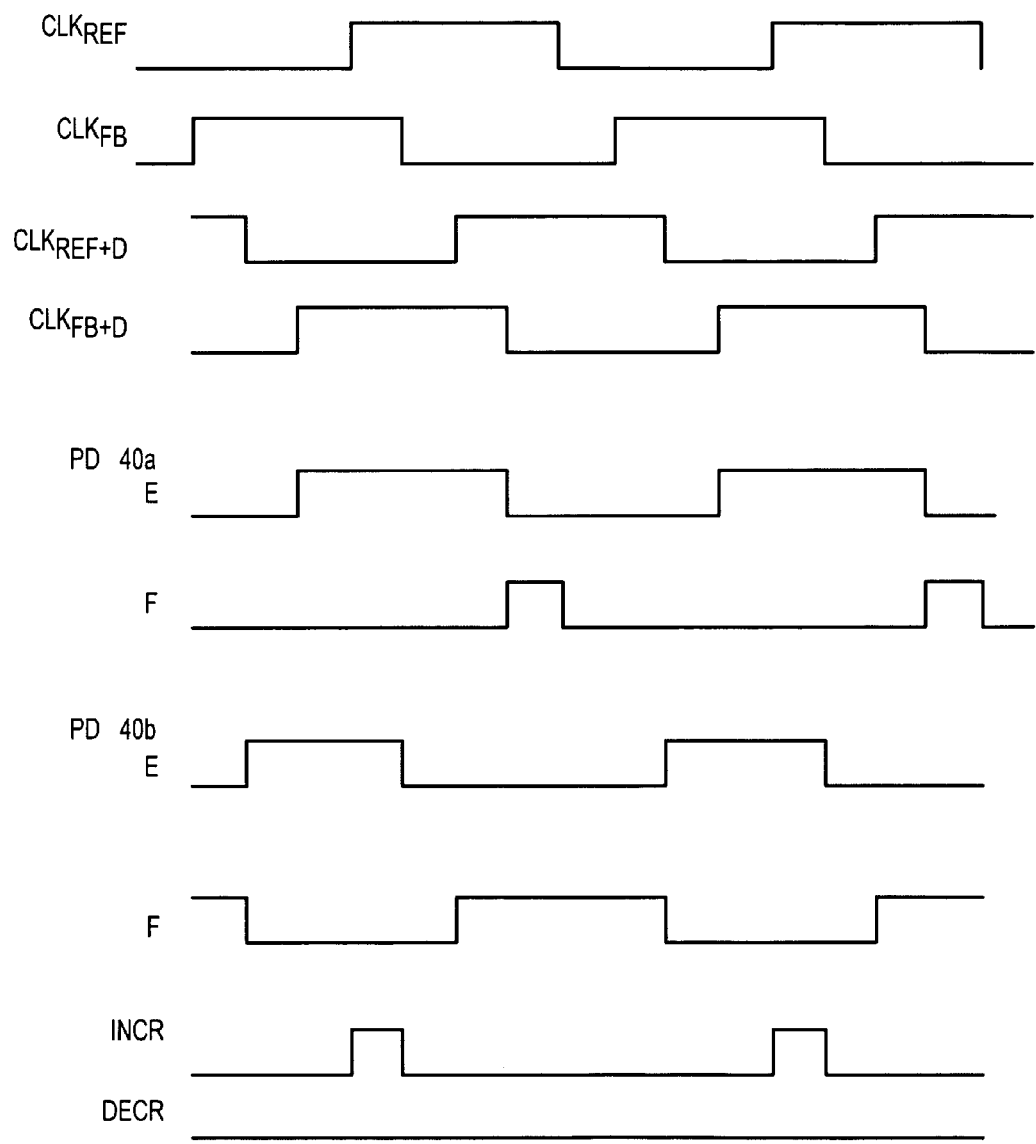
FIG. 11 is a timing diagram showing various signals in the phase detector of FIG. 8 in a situation where a $CLK_{FB}$ signal greatly leads a $CLK_{REF}$ signal.

The operation of the phase detector 80 of FIG. 8 when the phase of the $CLK_{FB}$ signal differs from the phase of the $CLK_{REF}$ signal by a relatively long delay period can be analyzed using the same methodology used to perform the analysis for relatively short delay periods. For the $CLK_{FB}$ signal greatly leading the $CLK_{REF}$ signal as shown in FIG. 11, the delay of the $CLK_{FB}$ signal coupled through the delay circuit 90 is not sufficient to cause the $CLK_{FB}$+D signal applied to the NAND gate 44 to lag the $CLK_{REF}$ signal applied to the input of the NAND gate 42 for the phase detector 40a. As a result, the $CLK_{FB}$+D signal applied to the NAND gate 44 leads the $CLK_{REF}$ signal applied to the input of the NAND gate 42 for the phase detector 40a. Therefore, the "E" and "F" signals from the phase detector 40a have the same characteristics as when the $CLK_{FB}$ signal leads the $CLK_{REF}$ signal as shown in FIG. 5. The "E" signal is thus the same as the $CLK_{FB}$+D signal applied to the NAND gate 44 for the phase detector 40a. The "F" signal has a rising edge that coincides with the falling edge of the $CLK_{FB}$+D signal applied to the NAND gate 44, and a falling edge that coincides with the falling edge of the $CLK_{REF}$ signal applied to the AND gate 42, as shown in FIG. 11.

Figure 1:
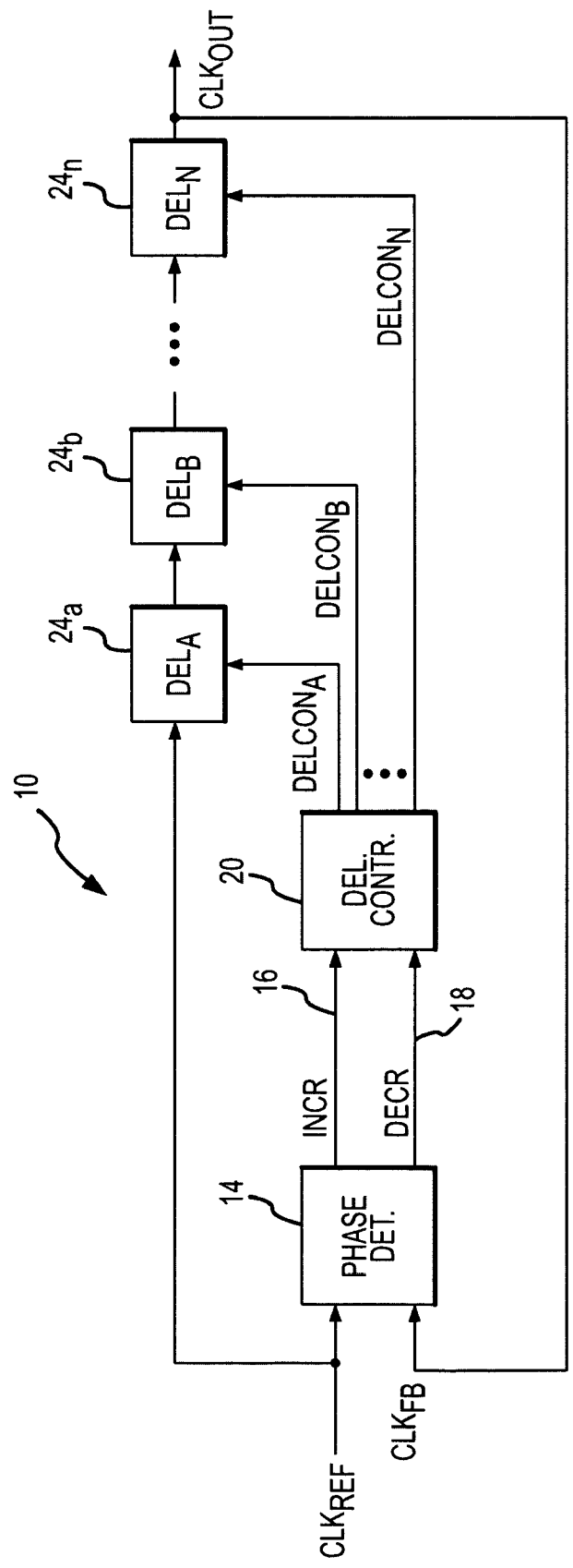
FIG. 1 is a block diagram of a conventional delay-lock loop using a conventional arbiter phase detector.
Figure 2:
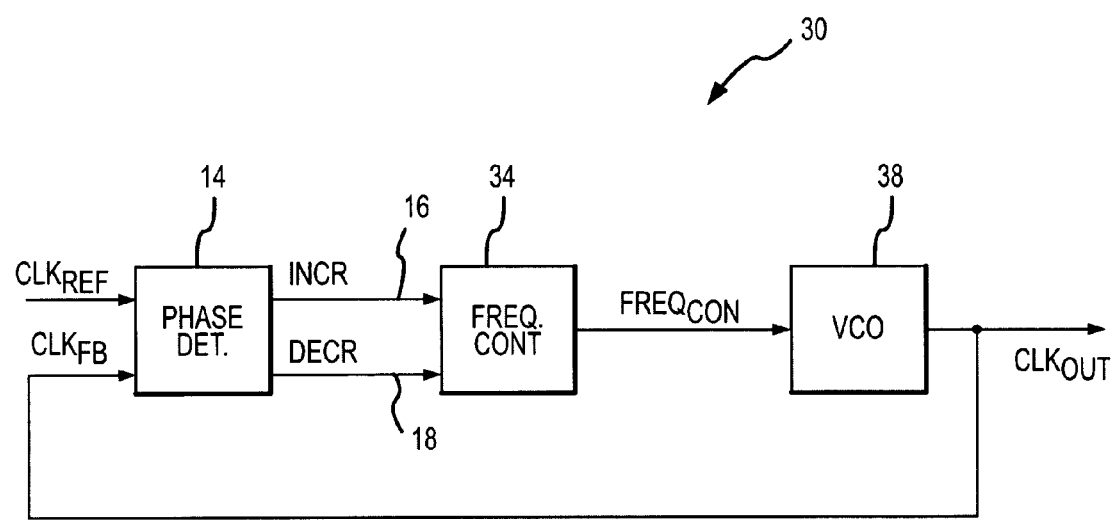
FIG. 2 is a block diagram of a conventional phase-lock loop using a conventional arbiter phase detector.

For the phase detector 40b, the $CLK_{REF}$+D signal applied to the NAND gate 42 leads the $CLK_{FB}$ signal applied to the NAND gate 44. The "E" and "F" signals therefore have characteristics that are similar to the characteristics of the "E" and "F" signals shown in FIG. 4 in which the $CLK_{REF}$ signal leads the $CLK_{FB}$ signal. As a result, the "E" signal has a rising edge that coincides with the falling edge of the $CLK_{REF}$+D signal applied to the NAND gate 42, and a falling edge that coincides with the falling edge of $CLK_{FB}$ signal applied to the NAND gate 44, as shown in FIG. 1. As in FIG. 4, the "F" signal is identical to the signal applied to the NAND gate 42, which, in the phase detector 40*b*, is the CLK$_{REF}$+D signal.

The INCR signal is active high whenever the "E" signals from both phase detectors 40*a* are high as long as the CLK$_{REF}$ signal and the CLK$_{FB}$ signal are also high. The "E" signals are both high from the rising edge of the "E" signal from the phase detector 40*a* until the falling edge of the "E" signal from the phase detector 40*b*. However, the CLK$_{REF}$ signal is low for the first half of this period. Therefore, the INCR signal does not transition high until the rising edge of the CLKR$_{FB}$ signal, as shown in FIG. 11. The times when the "F" signal from the phase detector 40*a* is high never coincides with the times when the "F" signal from the phase detector 40*b* is high. Therefore, the DECR signal is never active high.

Figure 12:
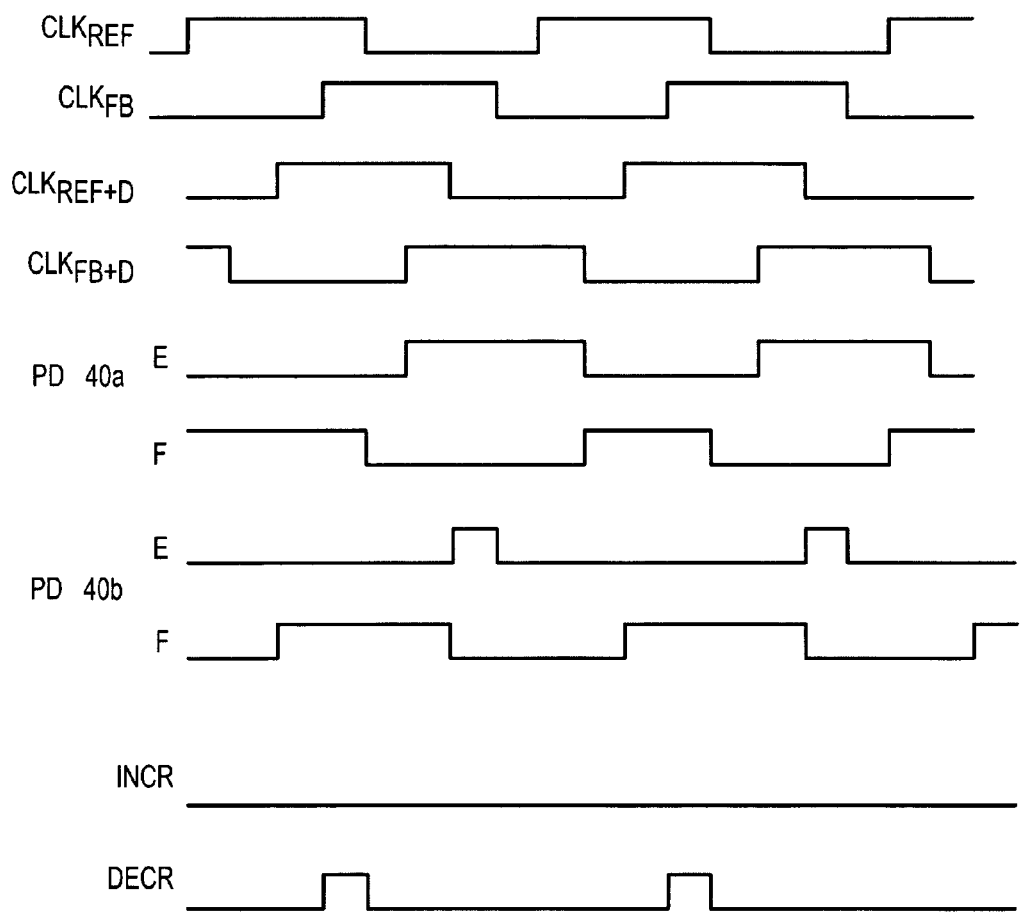
FIG. 12 is a timing diagram showing various signals in the phase detector of FIG. 8 in a situation where a $CLK_{FB}$ signal greatly lags a $CLK_{REF}$ signal.

Finally, the operation of the phase detector 80 of FIG. 8 when the CLK$_{FB}$ signal greatly lags the CLK$_{REF}$ signal is shown in FIG. 12. For the phase detector 40*a*, the CLK$_{REF}$ signal applied to the NAND gate 42 lags the CLK$_{FB}$+D signal applied to the NAND gate 44. The "E" and "F" signals therefore have characteristics that are similar to the characteristics of the "E" and "F" signals shown in FIG. 5 in which the CLK$_{REF}$ signal lags the CLK$_{FB}$ signal. As a result, the "E" signal is identical to the signal applied to the NAND gate 42, which, in the phase detector 40*a*, is the CLK$_{FB}$+D signal. The "F" signal shown in FIG. 5 has a rising edge that coincides with the falling edge of the CLK$_{FB}$ signal applied to the NAND gate 44 and a falling edge that coincides with the falling edge of the CLK$_{REF}$+D signal applied to the NAND gate 42. In the same manner, the "F" signal of the phase detector 40*a* has a rising edge that coincides with the falling edge of the CLK$_{FB}$ signal applied to the NAND gate 44 and a falling edge that coincides with the falling edge of the CLK$_{REF}$+D signal applied to the NAND gate 42, as shown in FIG. 12.

In the phase detector 40*b*, the CLK$_{FB}$ signal lags the CLK$_{REF}$+D signal in the same manner that the CLK$_{FB}$ signal lags the CLK$_{REF}$ signal as shown in FIG. 4. As a result, the signal "E" from the phase detector 40*b* has a rising edge that is coincident with the falling edge of the CLK$_{REF}$+D signal applied to the NAND gate 42 and a falling edge that is coincident with the falling edge of the CLK$_{FB}$ signal applied to the NAND gate 44. Also, the "F" signal is identical to the CLK$_{REF}$+D signal applied to the NAND gate 42 in the same manner that the "F" signal shown in FIG. 4 is identical to the CLK$_{REF}$ signal applied to the NAND gate 44.

The INCR signal remains inactive low because, during the only time that the "E" signals from both of the phase detectors 40*a,b* are high, the CLK$_{REF}$ signal is low. However, the "F" signals from the phase detectors 40*a,b* are both high during times when the CLK$_{REF}$ and CLR$_{FB}$ signals are both high, so that the DECR signal is periodically active high as shown in FIG. 12.

It is this seen that the phase detector 80 of FIG. 8 generates either an INCR signal or a DECR signal when the CLK$_{FB}$ signal either lead or lags the CLK$_{REF}$ by more than a predetermined phase difference. However, neither the INCR signal nor the DECR signal is generated as long as the phase difference between the CLK$_{FB}$ signal and the CLK$_{REF}$ signal is less than the predetermined phase difference.

Figure 13:
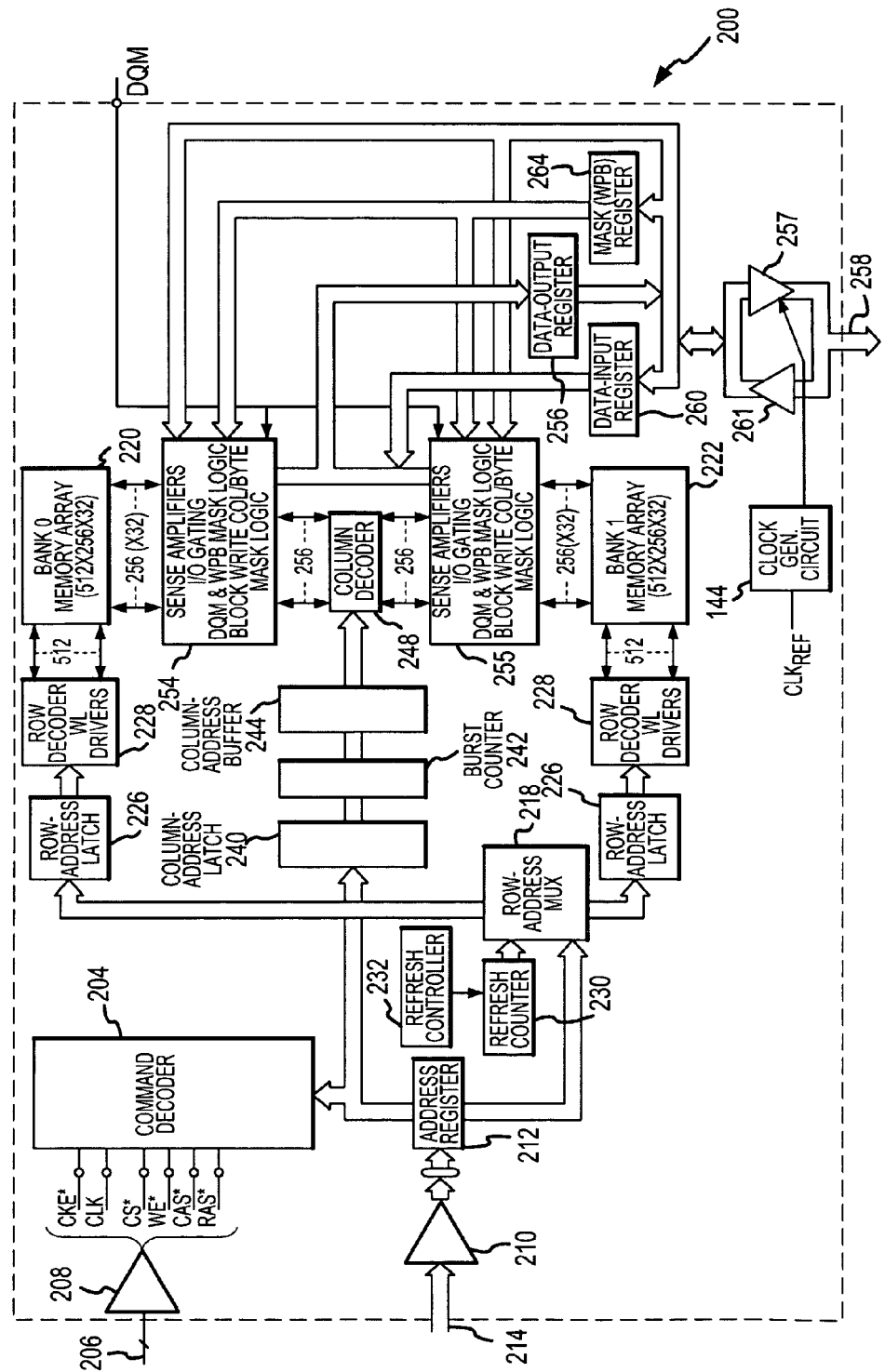
FIG. 13 is a block diagram of a memory device using a closed-loop clock generating circuit that includes the phase detector of FIG. 8 or some other embodiment of the invention.

A phase detector 140 according to various embodiments of the invention can be used in a closed loop clock generator circuit 144 to generate a read data strobe in the memory device shown in FIG. 13. With reference to FIG. 13, a synchronous dynamic random access memory ("SDRAM") 200 includes a command decoder 204 that controls the operation of the SDRAM 200 responsive to high-level command signals received on a control bus 206 and coupled thorough input receivers 208. These high level command signals, which are typically generated by a memory controller (not shown in FIG. 13), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 13). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe generated by the closed loop clock generator circuit 144, such as a delay-lock loop or a phase-lock loop, that uses an embodiment of a phase detector according to the present invention. The closed loop clock generator circuit 144 receives a periodic CLK$_{REF}$ signal and generates a CLK$_{OUT}$ signal, as explained above. The CLK$_{OUT}$ signal is used as a read data strobe so that the read data are coupled to the data bus 258 in substantially in phase with the CLK$_{REF}$ signal.

Data to be written to one of the arrays 220, 222 are coupled from the data bus 258 through data input receivers 261 to a data input register 262. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 14:
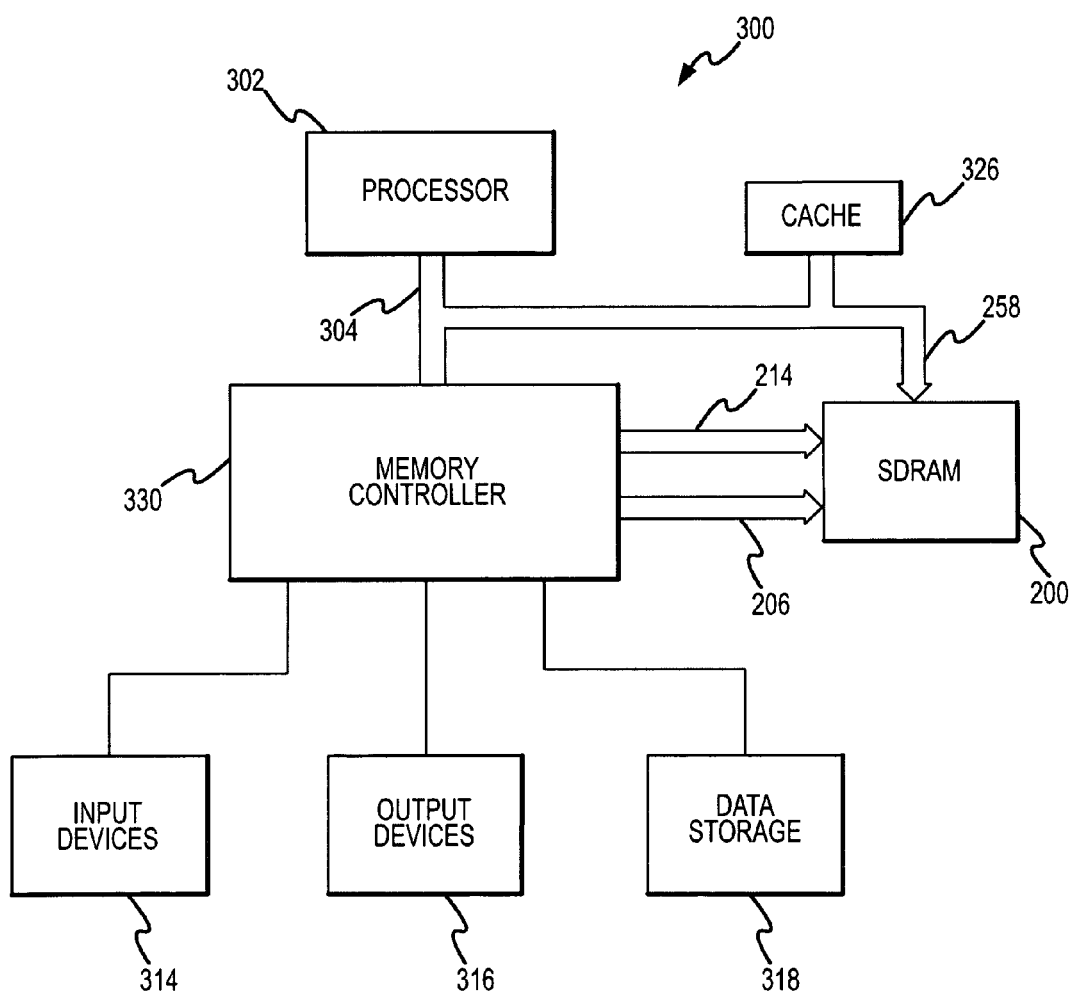
FIG. 14 is a block diagram of a computer system using the memory device of FIG. 13.

FIG. 14 shows an embodiment of a computer system 300 that may use the SDRAM 200 or some other memory device that uses one of the embodiments of a closed loop clock generator circuit incorporating a phase detector of the type described above or some other embodiment of the invention. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 518 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus coupled to the address bus 214 (FIG. 9) to couple row addresses and column addresses to the SDRAM 200. The memory controller 330 also includes a control bus that couples command signals to the control bus 206 of the SDRAM 200. The external data bus 258 of the SDRAM 200 is coupled to the data bus of the processor 302, either directly or through the memory controller 330.

Although the present invention has been described with reference to the disclosed embodiments, persons skilled in the art will recognize that changes may be made in form and detail without departing from the spirit and scope of the invention.

We claim:

1. A phase detector operable to generate either a first control signal or a second control signal responsive to a difference in phase between a first input signal and a second input signal, the phase detector comprising:
a signal comparator operable to compare the phase of the first input signal to the phase of the second input signal, the signal comparator comprising:
a first delay circuit having an output and an input coupled to receive the first input signal, the first delay circuit being operable to delay the first input signal by a first delay value and couple the delayed first input signal to the output;
a second delay circuit having an output and an input coupled to receive the second input signal, the second delay circuit being operable to delay the second input signal by a second delay value and couple the delayed second input signal to the output;
a third delay circuit having an output and an input coupled to receive the first input signal, the third delay circuit being operable to delay the first input signal by a third delay value and couple the delayed first input signal to the output;
a fourth delay circuit having an output and an input coupled to receive the second input signal, the fourth delay circuit being operable to delay the second input signal by a fourth delay value and couple the delayed second input signal to the output;
a first flip-flop having a set input coupled to the output of the first delay circuit, a reset input coupled to the output of the second delay circuit, and a pair of complimentary first and second outputs; and
a second flip-flop having a set input coupled to the output of the third delay circuit, a reset input coupled to the output of the fourth delay circuit, and a pair of complimentary first and second outputs; and
a signal generator coupled to the first and second flip-flops of the signal comparator, the signal generator being operable to generate the first control signal responsive to signals from the first and second flip-flops indicative of the phase of the first input signal being greater than the phase of the second input signal by at least a first phase difference, and to generate the second control signal responsive to signals from the first and second flip-flops indicative of the phase of the first input signal being less than the phase of the second input signal by at least a second phase difference, the signal generator further being operable to generate neither the first control signal nor the second control signal responsive to either signals from the first and second flip-flops indicative of the first input signal being greater than the phase of the second input signal by less than the first phase difference or signals from the first and second flip-flops indicative of the first input signal being less than the phase of the second input signal by less than the second phase difference.

2. The phase detector of claim 1 wherein the first phase difference is substantially equal to the second phase difference.

3. The phase detector of claim 1 wherein the second delay value and the third delay value are substantially equal to each other.

4. The phase detector of claim 1 wherein the first delay value and the fourth delay value are substantially equal to each other.

5. The phase detector of claim 4 wherein the first delay value and the fourth delay value are substantially equal to a delay of zero.

6. The phase detector of claim 1 wherein the signal generator comprises:
a first output circuit having first and second inputs coupled to the first and second outputs of the first flip-flop, respectively, the first output circuit being operable to couple a first logic level to a first output when the first output of the first flip-flop has the first logic level and the second output of the first flip-flop has a second logic level, to couple the first logic level to a second output when the second output of the first flip-flop has the first logic level and the first output of the first flip-flop has the second logic level, to couple the second logic level to the first output when the first output of the flip-flop has the second logic level, and to couple the second logic level to the second output circuit when the second output of the first flip-flop has the second logic level;
a second output circuit having first and second inputs coupled to the first and second outputs of the second flip-flop, respectively, the second output circuit being operable to couple the first logic level to a first output when the first output of the second flip-flop has the first logic level and the second output of the second flip-flop has the second logic level, to couple the first logic level to a second output when the second output of the second flip-flop has the first logic level and the first output of the second flip-flop has the second logic level, to couple the second logic level to the first output when the first output of the second flip-flop has the second logic level, and to couple the second logic level to the second output when the second output of the second flip-flop has the second logic level;

a first logic circuit having a first input coupled to the first output of the first output circuit, a second input coupled to the first output of the second output circuit, and an output on which the first control signal is generated; and a second logic circuit having a second input coupled to the second output of the first output circuit, a second input coupled to the second output of the second output circuit, and an output on which the second control signal is generated.

7. The phase detector of claim 6 wherein the first logic circuit is operable to generate the first control signal responsive to both the first output of the first output circuit and the first output of the second output circuit having the first logic level, and wherein the second logic circuit is operable to generate the second control signal responsive to both the second output of the first output circuit and the second output of the second output circuit having the first logic level.

8. The phase detector of claim 7 wherein the first and second logic circuits each receive the first and second input signals, and wherein the first and second control signal are generated only if the first and second input signals have the first logic level.

9. A delay-lock loop, comprising:
  a phase detector operable to compare the phase of a reference clock signal to the phase of a feedback clock signal, the phase detector being operable to generate an increase control signal responsive to the feedback clock signal leading the reference clock signal by at least a first delay time, and to generate a decrease control signal responsive to the feedback clock signal lagging the reference clock signal by at least a second delay time, the phase detector further being operable to generate neither the increase control signal nor the decrease control signal responsive to either the feedback clock signal leading the reference clock signal by less than the first delay time or the feedback clock signal lagging the reference clock signal by less than the second delay time, the phase detector comprising:
    a first delay circuit having an output and an input coupled to receive the reference clock signal, the first delay circuit being operable to delay the reference clock signal by a first delay value and couple the delayed reference clock signal to the output;
    a second delay circuit having an output and an input coupled to receive the feedback clock signal, the second delay circuit being operable to delay the feedback clock signal by a second delay value and couple the delayed feedback clock signal to the output;
    a third delay circuit having an output and an input coupled to receive the reference clock signal, the third delay circuit being operable to delay the reference clock signal by a third delay value and couple the delayed reference clock signal to the output;
    a fourth delay circuit having an output and an input coupled to receive the feedback clock signal, the fourth delay circuit being operable to delay the feedback clock signal by a fourth delay value and couple the delayed feedback clock signal to the output;
    a first flip-flop having a set input coupled to the output of the first delay circuit, a reset input coupled to the output of the second delay circuit, and a pair of complimentary first and second outputs from which one of the increase and decrease control signals is generated; and
    a second flip-flop having a set input coupled to the output of the third delay circuit, a reset input coupled to the output of the fourth delay circuit, and a pair of complimentary first and second outputs from which the other of the increase and decrease control signals is generated;
  a delay control circuit coupled to the first and second flip-flops of the phase detector, the delay control circuit being operable to generate a delay control signal responsive to the increase and decrease control signals from the phase detector; and
  a delay circuit coupled to the delay control circuit, the delay circuit being coupled to receive the reference clock signal and to delay the reference clock signal by a variable delay to generate the feedback clock signal from the delayed reference clock signal, the delay circuit being operable to increase the magnitude of the variable delay responsive to a delay control signal generated responsive to the increase control signal and to decrease the magnitude of the variable delay responsive to a delay control signal generated responsive to the decrease control signal.

10. The delay-lock loop of claim 9 wherein the second delay value and the third delay value are substantially equal to each other.

11. The delay-lock loop of claim 9 wherein the first delay time is substantially equal to the second delay time.

12. The delay-lock loop of claim 9 wherein the delay circuit is operable to increase the magnitude of the variable delay by a first delay increment responsive to the delay control signal generated responsive to the increase control signal and to decrease the magnitude of the variable delay by a second delay increment responsive to a delay control signal generated responsive to the decrease control signal.

13. The delay-lock loop of claim 12 wherein the first and second delay increments are each less than the sum of the first and second delay times.

14. The delay-lock loop of claim 9 wherein the first delay value and the fourth delay value are substantially equal to each other.

15. The delay-lock loop of claim 14 wherein the first delay value and the fourth delay value are substantially equal to a delay of zero.

16. The delay-lock loop of claim 9 wherein the phase detector further comprises:
  a first output circuit having first and second inputs coupled to the first and second outputs of the first flip-flop, respectively, the first output circuit being operable to couple a first logic level to a first output when the first output of the first flip-flop has the first logic level and the second output of the first flip-flop has a second logic level, to couple the first logic level to a second output when the second output of the first flip-flop has the first logic level and the first output of the first flip-flop has the second logic level, to couple the second logic level to the first output when the first output of the flip-flop has the second logic level, and to couple the second logic level to the second output circuit when the second output of the first flip-flop has the second logic level;

a second output circuit having first and second inputs coupled to the first and second outputs of the second flip-flop, respectively, the second output circuit being operable to couple the first logic level to a first output when the first output of the second flip-flop has the first logic level and the second output of the second flip-flop has the second logic level, to couple the first logic level to a second output when the second output of the second flip-flop has the first logic level and the first output of the second flip-flop has the second logic level, to couple the second logic level to the first output when the first output of the second flip-flop has the second logic level, and to couple the second logic level to the second output when the second output of the second flip-flop has the second logic level;

a first logic circuit having a first input coupled to the first output of the first output circuit, a second input coupled to the first output of the second output circuit, and an output on which the increase control signal is generated; and a second logic circuit having a second input coupled to the second output of the first output circuit, a second input coupled to the second output of the second output circuit, and an output on which the decrease control signal is generated.

17. The delay-lock loop of claim 16 wherein the first logic circuit is operable to generate the increase control signal responsive to both the first output of the first output circuit and the first output of the second output circuit having the first logic level, and wherein the second logic circuit is operable to generate the decrease control signal responsive to both the second output of the first output circuit and the second output of the second output circuit having the first logic level.

18. The delay-lock loop of claim 17 wherein the first and second logic circuits each receive the reference clock signal and the feedback clock signal, and wherein the increase and decrease control signal are generated only if the reference clock signal and the feedback clock signal have the first logic level.

19. A phase-lock loop, comprising:
a phase detector operable to compare the phase of a reference clock signal to the phase of a feedback clock signal, the phase detector being operable to generate an increase control signal responsive to the feedback clock signal leading the reference clock signal by at least a first time, and to generate a decrease control signal responsive to the feedback clock signal lagging the reference clock signal by at least a second time, the phase detector further being operable to generate neither the increase control signal nor the decrease control signal responsive to either the feedback clock signal leading the reference clock signal by less than the first time or the feedback clock signal lagging the reference clock signal by less than the second time, the phase detector comprising:
a first delay circuit having an output and an input coupled to receive the reference clock signal, the first delay circuit being operable to delay the reference clock signal by a first delay value and couple the delayed reference clock signal to the output;
a second delay circuit having an output and an input coupled to receive the feedback clock signal, the second delay circuit being operable to delay the feedback clock signal by a second delay value and couple the delayed feedback clock signal to the output;
a third delay circuit having an output and an input coupled to receive the reference clock signal, the third delay circuit being operable to delay the reference clock signal by a third delay value and couple the delayed reference clock signal to the output;
a fourth delay circuit having an output and an input coupled to receive the feedback clock signal, the fourth delay circuit being operable to delay the feedback clock signal by a fourth delay value and couple the delayed feedback clock signal to the output;
a first flip-flop having a set input coupled to the output of the first delay circuit, a reset input coupled to the output of the second delay circuit, and a pair of complimentary first and second outputs from which one of the increase and decrease control signals is generated; and
a second flip-flop having a set input coupled to the output of the third delay circuit, a reset input coupled to the output of the fourth delay circuit, and a pair of complimentary first and second outputs from which the other of the increase and decrease control signals is generated;

a frequency control circuit coupled to the first and second flip-flops of the phase detector, the frequency control circuit being operable to generate a frequency control signal responsive to the increase and decrease control signals from the phase detector; and a voltage controlled oscillator coupled to the frequency control circuit, the voltage controlled oscillator being operable to generate the feedback clock signal with a period that increases responsive to a frequency control signal generated responsive to the increase control signal and that decreases responsive to a frequency control signal generated responsive to the decrease control signal.

20. The phase-lock loop of claim 19 wherein the voltage controlled oscillator is operable to increase the period of the feedback clock signal by a first time increment responsive to a frequency control signal generated responsive to the increase control signal, and that decreases by a second time increment responsive to a frequency control signal generated responsive to the decrease control signal.

21. The phase-lock loop of claim 20 wherein each of the first and second time increments is less than the sum of the first and second times.

22. The phase-lock loop of claim 19 wherein the first time is substantially equal to the second time.

23. The phase-lock loop of claim 19 wherein the first delay value and the fourth delay value are substantially equal to each other.

24. The phase-lock loop of claim 23 wherein the second delay value and the third delay value are substantially equal to each other.

25. The phase-lock loop of claim 23 wherein the first delay value and the fourth delay value are substantially equal to a delay of zero.

26. The phase-lock loop of claim 23 wherein the phase detector further comprises:
a first output circuit having first and second inputs coupled to the first and second outputs of the first flip-flop, respectively, the first output circuit being operable to couple a first logic level to a first output when the first output of the first flip-flop has the first logic level and the second output of the first flip-flop has a second logic level, to couple the first logic level to a second output when the second output of the first flip-flop has the first logic level and the first output of the first flip-flop has the second logic level, to couple the second logic level to the first output when the first output of the flip-flop has the second logic level, and to couple the second logic level to the second output circuit when the second output of the first flip-flop has the second logic level;

a second output circuit having first and second inputs coupled to the first and second outputs of the second flip-flop, respectively, the second output circuit being operable to couple the first logic level to a first output when the first output of the second flip-flop has the first logic level and the second output of the second flip-flop has the second logic level, to couple the first logic level to a second output when the second output of the second flip-flop has the first logic level and the first output of the second flip-flop has the second logic level, to couple the second logic level to the first output when the first output of the second flip-flop has the second logic level, and to couple the second logic level to the second output when the second output of the second flip-flop has the second logic level;

a first logic circuit having a first input coupled to the first output of the first output circuit, a second input coupled to the first output of the second output circuit, and an output on which the increase control signal is generated; and a second logic circuit having a second input coupled to the second output of the first output circuit, a second input coupled to the second output of the second output circuit, and an output on which the decrease control signal is generated.

27. The phase-lock loop of claim 26 wherein the first logic circuit is operable to generate the increase control signal responsive to both the first output of the first output circuit and the first output of the second output circuit having the first logic level, and wherein the second logic circuit is operable to generate the decrease control signal responsive to both the second output of the first output circuit and the second output of the second output circuit having the first logic level.

28. The phase-lock loop of claim 27 wherein the first and second logic circuits each receive the reference clock signal and the feedback clock signal, and wherein the increase and decrease control signal are generated only if the reference clock signal and the feedback clock signal have the first logic level.

29. A memory device, comprising:
a row address circuit operable to receive and decode row address signals applied to external address terminals of the memory device;
a column address circuit operable to receive and decode column address signals applied to the external address terminals;
a memory cell array operable to store data written to or read from the array at a location determined by the decoded row address signals and the decoded column address signals;
a clock generator circuit operable to generate an output clock signal from a reference clock signal, the clock generator circuit comprising:

a phase detector operable to compare the phase of the reference clock signal to the phase of a feedback clock signal, the phase detector being operable to generate an increase control signal responsive to the feedback clock signal leading the reference clock signal by at least a first time, and to generate a decrease control signal responsive to the feedback clock signal lagging the reference clock signal by at least a second time, the phase detector further being operable to generate neither the increase control signal nor the decrease control signal responsive to either the feedback clock signal leading the reference clock signal by less than the first time or the feedback clock signal lagging the reference clock signal by less than the second time, the phase detector comprising:
a first delay circuit having an output and an input coupled to receive the reference clock signal, the first delay circuit being operable to delay the reference clock signal by a first delay value and couple the delayed reference clock signal to the output;
a second delay circuit having an output and an input coupled to receive the feedback clock signal, the second delay circuit being operable to delay the feedback clock signal by a second delay value and couple the delayed feedback clock signal to the output;
a third delay circuit having an output and an input coupled to receive the reference clock signal, the third delay circuit being operable to delay the reference clock signal by a third delay value and couple the delayed reference clock signal to the output;
a fourth delay circuit having an output and an input coupled to receive the feedback clock signal, the fourth delay circuit being operable to delay the feedback clock signal by a fourth delay value and couple the delayed feedback clock signal to the output;
a first flip-flop having a set input coupled to the output of the first delay circuit, a reset input coupled to the output of the second delay circuit, and a pair of complimentary first and second outputs from which one of the increase and decrease control signals is generated; and
a second flip-flop having a set input coupled to the output of the third delay circuit, a reset input coupled to the output of the fourth delay circuit, and a pair of complimentary first and second outputs from which the other of the increase and decrease control signals is generated;
a delay control circuit coupled to the first and second flip-flops of the phase detector, the delay control circuit being operable to generate a delay control signal responsive to the increase and decrease control signals from the phase detector; and
a delay circuit coupled to the delay control circuit, the delay circuit being coupled to receive the reference clock signal and to delay the reference clock signal by a variable delay to generate the output clock signal and the feedback clock signal from the delayed reference clock signal, the delay circuit being operable to increase the magnitude of the variable delay responsive to a delay control signal generated responsive to the increase control signal and to decrease the magnitude of the variable delay responsive to a delay control signal generated responsive to the decrease control signal;

a data path circuit operable to couple data signals corresponding to the data between the array and data bus terminals of the memory device, the data path circuit comprising a plurality of read data latches each having an input terminal coupled to the array, an output terminal coupled to a respective data bus terminal, and a clock terminal coupled to receive the output clock signal from the clock generator circuit, the read data latches being operable to couple read data bits from the output latch to the data bus terminals responsive to a transition of the output clock signal; and a command decoder operable to decode a plurality of command signals applied to respective external command terminals of the memory device, the command decoder being operable to generate control signals corresponding to the decoded command signals.

30. The memory device of claim 29 wherein the memory cell array comprises a dynamic random access memory cell array.

31. The memory device of claim 29 wherein the delay circuit is operable to increase the magnitude of the variable delay by a first delay increment responsive to the delay control signal generated responsive to the increase control signal and to decrease the magnitude of the variable delay by a second delay increment responsive to a delay control signal generated responsive to the decrease control signal.

32. The memory device of claim 31 wherein each of the first and second delay increments is less than the sum of the first and second delay times.

33. The memory device of claim 29 wherein the first time is substantially equal to the second time.

34. The memory device of claim 29 wherein the first delay value and the fourth delay value are substantially equal to each other.

35. The memory device of claim 34 wherein the second delay value and the third delay value are substantially equal to each other.

36. The memory device of claim 34 wherein the first delay value and the fourth delay value are substantially equal to a delay of zero.

37. The memory device of claim 34 wherein the phase detector further comprises:

a first output circuit having first and second inputs coupled to the first and second outputs of the first flip-flop, respectively, the first output circuit being operable to couple a first logic level to a first output when the first output of the first flip-flop has the first logic level and the second output of the first flip-flop has a second logic level, to couple the first logic level to a second output when the second output of the first flip-flop has the first logic level and the first output of the first flip-flop has the second logic level, to couple the second logic level to the first output when the first output of the flip-flop has the second logic level, and to couple the second logic level to the second output circuit when the second output of the first flip-flop has the second logic level;

a second output circuit having first and second inputs coupled to the first and second outputs of the second flip-flop, respectively, the second output circuit being operable to couple the first logic level to a first output when the first output of the second flip-flop has the first logic level and the second output of the second flip-flop has the second logic level, to couple the first logic level to a second output when the second output of the second flip-flop has the first logic level and the first output of the second flip-flop has the second logic level, to couple the second logic level to the first output when the first output of the second flip-flop has the second logic level, and to couple the second logic level to the second output when the second output of the second flip-flop has the second logic level;

a first logic circuit having a first input coupled to the first output of the first output circuit, a second input coupled to the first output of the second output circuit, and an output on which the increase control signal is generated; and a second logic circuit having a second input coupled to the second output of the first output circuit, a second input coupled to the second output of the second output circuit, and an output on which the decrease control signal is generated.

38. The memory device of claim 37 wherein the first logic circuit is operable to generate the increase control signal responsive to both the first output of the first output circuit and the first output of the second output circuit having the first logic level, and wherein the second logic circuit is operable to generate the decrease control signal responsive to both the second output of the first output circuit and the second output of the second output circuit having the first logic level.

39. The memory device of claim 38 wherein the first and second logic circuits each receive the reference clock signal and the feedback clock signal, and wherein the increase and decrease control signal are generated only if the reference clock signal and the feedback clock signal have the first logic level.

40. A computer system, comprising:

a processor having a processor bus;

an input device coupled to the processor through the processor bus to allow data to be entered into the computer system;

an output device coupled to the processor through the processor bus to allow data to be output from the computer system;

a data storage device coupled to the processor through the processor bus to allow data to be read from a mass storage device; and a memory device coupled to the processor, the memory device comprising:

a row address circuit operable to receive and decode row address signals applied to external address terminals of the memory device;

a column address circuit operable to receive and decode column address signals applied to the external address terminals;

a memory cell array operable to store data written to or read from the array at a location determined by the decoded row address signals and the decoded column address signals;

a clock generator circuit operable to generate an output clock signal from a reference clock signal, the clock generator circuit comprising:

a phase detector operable to compare the phase of the reference clock signal to the phase of a feedback clock signal, the phase detector being operable to generate an increase control signal responsive to the feedback clock signal leading the reference clock signal by at least a first time, and to generate a decrease control signal responsive to the feedback clock signal lagging the reference clock signal by at least a second time, the phase detector further being operable to generate neither the increase control signal nor the decrease control signal responsive to either the feedback clock signal leading the reference clock signal by less than the first time or the feedback clock signal lagging the reference clock signal by less than the second time, the phase detector comprising:

a first delay circuit having an output and an input coupled to receive the reference clock signal, the first delay circuit being operable to delay the reference clock signal by a first delay value and couple the delayed reference clock signal to the output;

a second delay circuit having an output and an input coupled to receive the feedback clock signal, the second delay circuit being operable to delay the feedback clock signal by a second delay value and couple the delayed feedback clock signal to the output;

a third delay circuit having an output and an input coupled to receive the reference clock signal, the third delay circuit being operable to delay the reference clock signal by a third delay value and couple the delayed reference clock signal to the output;

a fourth delay circuit having an output and an input coupled to receive the feedback clock signal, the fourth delay circuit being operable to delay the feedback clock signal by a fourth delay value and couple the delayed feedback clock signal to the output;

a first flip-flop having a set input coupled to the output of the first delay circuit, a reset input coupled to the output of the second delay circuit, and a pair of complimentary first and second outputs from which one of the increase and decrease control signals is generated; and a second flip-flop having a set input coupled to the output of the third delay circuit, a reset input coupled to the output of the fourth delay circuit, and a pair of complimentary first and second outputs from which the other of the increase and decrease control signals is generated;

a delay control circuit coupled to the first and second flip-flops of the phase detector, the delay control circuit being operable to generate a delay control signal responsive to the increase and decrease control signals from the phase detector; and a delay circuit coupled to the delay control circuit, the delay circuit being coupled to receive the reference clock signal and to delay the reference clock signal by a variable delay to generate the output clock signal and the feedback clock signal from the delayed reference clock signal, the delay circuit being operable to increase the magnitude of the variable delay responsive to a delay control signal generated responsive to the increase control signal and to decrease the magnitude of the variable delay responsive to a delay control signal generated responsive to the decrease control signal;

a data path circuit operable to couple data signals corresponding to the data between the array and data bus terminals of the memory device, the data path circuit comprising a plurality of read data latches each having an input terminal coupled to the array, an output terminal coupled to a respective data bus terminal, and a clock terminal coupled to receive the output clock signal from the clock generator circuit, the read data latches being operable to couple read data bits from the output latch to the data bus terminals responsive to a transition of the output clock signal; and a command decoder operable to decode a plurality of command signals applied to respective external command terminals of the memory device, the command decoder being operable to generate control signals corresponding to the decoded command signals.

41. The computer system of claim 40 wherein the second delay value and the third delay value are substantially equal to each other.

42. The computer system of claim 40 wherein the memory cell array comprises a dynamic random access memory cell array.

43. The computer system of claim 40 wherein the delay circuit is operable to increase the magnitude of the variable delay by a first delay increment responsive to the delay control signal generated responsive to the increase control signal and to decrease the magnitude of the variable delay by a second delay increment responsive to a delay control signal generated responsive to the decrease control signal.

44. The computer system of claim 43 wherein each of the first and second delay increments is less than the sum of the first and second delay times.

45. The computer system of claim 40 wherein the first time is substantially equal to the second time.

46. The computer system of claim 40 wherein the first delay value and the fourth delay value are substantially equal to each other.

47. The computer system of claim 46 wherein the first delay value and the fourth delay value are substantially equal to a delay of zero.

48. The computer system of claim 40 wherein the phase detector further comprises:

a first output circuit having first and second inputs coupled to the first and second outputs of the first flip-flop, respectively, the first output circuit being operable to couple a first logic level to a first output when the first output of the first flip-flop has the first logic level and the second output of the first flip-flop has a second logic level, to couple the first logic level to a second output when the second output of the first flip-flop has the first logic level and the first output of the first flip-flop has the second logic level, to couple the second logic level to the first output when the first output of the flip-flop has the second logic level, and to couple the second logic level to the second output circuit when the second output of the first flip-flop has the second logic level;

a second output circuit having first and second inputs coupled to the first and second outputs of the second flip-flop, respectively, the second output circuit being operable to couple the first logic level to a first output when the first output of the second flip-flop has the first logic level and the second output of the second flip-flop has the second logic level, to couple the first logic level to a second output when the second output of the second flip-flop has the first logic level and the first output of the second flip-flop has the second logic level, to couple the second logic level to the first output when the first output of the second flip-flop has the second logic level, and to couple the second logic level to the second output when the second output of the second flip-flop has the second logic level;

a first logic circuit having a first input coupled to the first output of the first output circuit, a second input coupled to the first output of the second output circuit, and an output on which the increase control signal is generated; and a second logic circuit having a second input coupled to the second output of the first output circuit, a second input coupled to the second output of the second output circuit, and an output on which the decrease control signal is generated.

49. The computer system of claim 48 wherein the first logic circuit is operable to generate the increase control signal responsive to both the first output of the first output circuit and the first output of the second output circuit having the first logic level, and wherein the second logic circuit is operable to generate the decrease control signal responsive to both the second output of the first output circuit and the second output of the second output circuit having the first logic level.

50. The computer system of claim 49 wherein the first and second logic circuits each receive the reference clock signal and the feedback clock signal, and wherein the increase and decrease control signal are generated only if the reference clock signal and the feedback clock signal have the first logic level.

* * * * *